(12) United States Patent
Ruth

(10) Patent No.: US 10,676,812 B2
(45) Date of Patent: Jun. 9, 2020

(54) EVAPORATION SOURCE

(71) Applicant: FLISOM AG, Niederhasli (CH)

(72) Inventor: Marta Ruth, Pfaffhausen (CH)

(73) Assignee: FLISOM AG, Niederhasli (CH)

( * ) Notice: Subject to any disclaimer, the term of this patent is extended or adjusted under 35 U.S.C. 154(b) by 318 days.

(21) Appl. No.: 15/753,474

(22) PCT Filed: Aug. 17, 2016

(86) PCT No.: PCT/IB2016/001142
§ 371 (c)(1),
(2) Date: Feb. 19, 2018

(87) PCT Pub. No.: WO2017/033051
PCT Pub. Date: Mar. 2, 2017

(65) Prior Publication Data
US 2018/0245208 A1  Aug. 30, 2018

Related U.S. Application Data

(60) Provisional application No. 62/208,417, filed on Aug. 21, 2015.

(51) Int. Cl.
*C23C 14/54* (2006.01)
*C23C 14/24* (2006.01)
(Continued)

(52) U.S. Cl.
CPC ............ *C23C 14/243* (2013.01); *C23C 14/26* (2013.01); *C23C 14/541* (2013.01); *C23C 14/542* (2013.01); *C23C 14/562* (2013.01)

(58) Field of Classification Search
CPC ..... C23C 14/243; C23C 14/541; C23C 14/26; C23C 14/562; C23C 14/542;
(Continued)

(56) References Cited

U.S. PATENT DOCUMENTS 5,037,624 A * 8/1991 Tom ................... B01D 53/02
422/180
5,480,678 A * 1/1996 Rudolph ............... C04B 35/83
427/248.1
(Continued)

FOREIGN PATENT DOCUMENTS

EP  1342808 A1  10/2003
EP  1927674 A2  6/2008
(Continued)

OTHER PUBLICATIONS

PCT International Search Report and Written Opinion dated Feb. 7, 2017, for PCT/IB2016/001142, filed Aug. 17, 2016.
(Continued)

*Primary Examiner* — Rudy Zervigon
(74) *Attorney, Agent, or Firm* — Patterson + Sheridan, L.L.P.

(57) ABSTRACT

Embodiments of the disclosure generally relate to evaporation sources used for physical vapor deposition of material onto substrates and more particularly for controlled coating of large substrates, such as vacuum deposition of selenium on flexible substrates. In one embodiment an evaporation source for depositing a source material on a substrate is provided. The evaporation source includes a crucible having a base and a first plurality of walls surrounding an interior region of the crucible. The crucible further includes a supporting ridge extending inwardly towards the interior region. The evaporation source further includes a lid disposed on the supporting ridge, the lid including two or more adjacently positioned sheets, where each sheet includes a plurality of openings formed therethrough, and the plurality of openings in each sheet are not aligned with the plurality of openings formed in an adjacently positioned sheet.

20 Claims, 11 Drawing Sheets

(51) Int. Cl.
*C23C 14/26* (2006.01)
*C23C 14/56* (2006.01)

(58) Field of Classification Search
CPC ......... C23C 16/4402; C23C 16/45544; C23C 16/405; C23C 16/45578; C23C 16/448; H01L 21/67017; B01D 45/08; B01D 50/002
USPC ............... 118/723 VE, 726; 156/345.29
See application file for complete search history.

(56) References Cited

U.S. PATENT DOCUMENTS

| | | | | |
|---|---|---|---|---|
| 5,520,858 A * | 5/1996 | Yamaguchi | ........... | B01D 1/0076 261/122.1 |
| 5,785,902 A * | 7/1998 | Yamaguchi | ........... | B01D 1/0076 261/130 |
| 5,803,938 A * | 9/1998 | Yamaguchi | ........... | B01D 1/0076 118/726 |
| 5,904,957 A * | 5/1999 | Christin | ................ | C23C 16/045 427/248.1 |
| 5,953,634 A * | 9/1999 | Kajita | ................ | C23C 16/0272 257/E21.295 |
| 6,056,820 A * | 5/2000 | Balakrishna | ............ | C30B 23/00 117/200 |
| 6,406,539 B1 * | 6/2002 | Shigeto | ................... | C30B 23/00 117/88 |
| 6,444,043 B1 | 9/2002 | Gegenwart et al. | | |
| 6,669,988 B2 * | 12/2003 | Daws | ................ | C23C 16/045 427/249.2 |
| 6,911,234 B2 * | 6/2005 | Warnes | ............... | C23C 16/4557 427/248.1 |
| 6,942,893 B2 * | 9/2005 | Delperier | ............... | C04B 35/83 118/719 |
| 6,953,605 B2 * | 10/2005 | Sion | ................... | C04B 35/83 427/248.1 |
| 7,060,134 B2 * | 6/2006 | Chang | ................ | C04B 35/522 118/728 |
| 7,182,980 B2 * | 2/2007 | Goujard | ............... | C23C 16/455 427/249.3 |
| 7,339,139 B2 | 3/2008 | Yang et al. | | |
| 7,476,419 B2 * | 1/2009 | Rudolph | ............... | C23C 16/045 427/249.2 |
| 7,487,956 B2 * | 2/2009 | Gregg | ................ | C23C 16/4481 118/726 |
| 7,488,512 B2 * | 2/2009 | Suzuki | ................... | C23C 16/16 419/1 |
| 7,651,570 B2 * | 1/2010 | Brcka | .................... | C23C 16/16 118/726 |
| 7,691,440 B2 * | 4/2010 | Bernard | ................. | C04B 35/83 118/719 |
| 7,691,443 B2 * | 4/2010 | Rudolph | ............... | C04B 35/83 427/249.2 |
| 7,828,274 B2 * | 11/2010 | Gregg | ................ | C23C 16/4483 261/142 |
| 7,846,256 B2 * | 12/2010 | Suzuki | ................ | C23C 16/4481 118/726 |
| 7,959,973 B2 * | 6/2011 | Waghray | ................ | C04B 35/83 427/249.1 |
| 7,967,911 B2 * | 6/2011 | Carlson | ............... | C23C 16/4482 118/723 VE |
| 8,057,855 B1 * | 11/2011 | Rudolph | ................ | C04B 35/83 427/249.1 |
| 8,128,073 B2 * | 3/2012 | Gregg | ................ | C23C 16/4481 261/142 |
| 8,293,011 B2 * | 10/2012 | Miyanaga | ............ | C30B 23/005 117/200 |
| 8,313,804 B2 * | 11/2012 | Carlson | ................ | C23C 16/4482 427/237 |
| 8,444,120 B2 * | 5/2013 | Gregg | ................ | C23C 16/4483 261/142 |
| 8,821,640 B2 * | 9/2014 | Cleary | ................ | C23C 14/48 118/726 |
| 9,004,462 B2 * | 4/2015 | Gregg | ................ | C23C 16/4481 261/142 |
| 9,469,898 B2 * | 10/2016 | Gregg | ................ | C23C 16/4483 |
| 9,663,853 B2 * | 5/2017 | Yanagi | ................... | C23C 14/12 |
| 9,702,058 B2 * | 7/2017 | Shin | ........................ | C30B 23/00 |
| 9,828,670 B2 * | 11/2017 | Goujard | ............... | C23C 16/045 |
| 9,845,534 B2 * | 12/2017 | Delperier | ............... | C23C 16/045 |
| 9,863,034 B2 * | 1/2018 | Yanagi | ................... | C23C 14/12 |
| 9,963,779 B2 * | 5/2018 | Rudolph | ................ | C23C 16/52 |
| 9,982,341 B2 * | 5/2018 | Schoepp | ............ | C23C 16/4481 |
| 10,147,597 B1 * | 12/2018 | Lee | ................... | H01L 21/02104 |
| 10,294,584 B2 * | 5/2019 | Gupta | ................... | C30B 23/005 |
| 10,385,452 B2 * | 8/2019 | Hendrix | ................. | B01B 1/005 |
| 10,392,700 B2 * | 8/2019 | Baum | ................ | C23C 16/4483 |
| 10,465,282 B2 * | 11/2019 | Rudolph | ............... | C23C 16/045 |
| 2003/0035893 A1 * | 2/2003 | Daws | ................ | C23C 16/045 427/255.28 |
| 2004/0016404 A1 * | 1/2004 | Gregg | ........................ | F17C 3/02 118/726 |
| 2004/0237898 A1 * | 12/2004 | Bernard | ................ | C04B 35/83 118/724 |
| 2005/0000427 A1 * | 1/2005 | Lee | ..................... | C23C 16/4481 118/715 |
| 2005/0034671 A1 | 2/2005 | Ohara | | |
| 2005/0147753 A1 | 7/2005 | Smith | | |
| 2006/0037540 A1 * | 2/2006 | Woelk | ................ | C23C 16/4481 118/726 |
| 2006/0185597 A1 * | 8/2006 | Suzuki | ................ | C23C 16/4481 118/726 |
| 2006/0263525 A1 * | 11/2006 | Sion | ....................... | C23C 16/045 427/249.2 |
| 2007/0266949 A1 * | 11/2007 | Shenai-Khatkhate | ....................... | C23C 16/4481 118/726 |
| 2008/0092816 A1 * | 4/2008 | Birtcher | .............. | C23C 16/4481 118/715 |
| 2008/0191153 A1 * | 8/2008 | Marganski | ................ | B01J 7/00 250/492.21 |
| 2009/0107401 A1 * | 4/2009 | Reinhold | ................ | B01B 1/005 118/726 |
| 2009/0181168 A1 * | 7/2009 | Chaubey | ............... | C23C 16/4481 427/248.1 |
| 2010/0139564 A1 | 6/2010 | Lee et al. | | |
| 2010/0255198 A1 * | 10/2010 | Cleary | ................ | C23C 16/4402 118/726 |
| 2011/0000430 A1 * | 1/2011 | Yanagi | ................... | C23C 14/12 118/688 |
| 2011/0005462 A1 * | 1/2011 | Yanagi | ................... | C23C 14/12 118/726 |
| 2011/0076399 A1 | 3/2011 | Shim et al. | | |
| 2013/0061969 A1 * | 3/2013 | Koike | .............. | H01L 21/67017 138/37 |
| 2013/0340680 A1 * | 12/2013 | Sonoda | .................. | C23C 14/243 118/720 |
| 2014/0182515 A1 * | 7/2014 | Yamazaki | ............ | C23C 16/4481 118/722 |
| 2014/0329025 A1 * | 11/2014 | Cleary | ................... | C23C 16/30 427/523 |
| 2015/0191819 A1 * | 7/2015 | Hendrix | ............... | C23C 16/4402 118/728 |
| 2015/0218691 A1 * | 8/2015 | Yanagi | ................... | C23C 14/12 427/9 |
| 2017/0037511 A1 * | 2/2017 | Cleary | ................ | C23C 16/4402 |
| 2017/0233864 A1 * | 8/2017 | Park | ..................... | C23C 14/243 118/725 |
| 2017/0283948 A1 * | 10/2017 | Chiu | .................... | H01J 37/3244 |
| 2017/0342557 A1 * | 11/2017 | Baum | ................ | C23C 16/4481 |
| 2018/0274093 A1 * | 9/2018 | Takagi | ................ | C23C 16/4402 |
| 2019/0032206 A1 * | 1/2019 | Hodges | ............ | C23C 16/45544 |

FOREIGN PATENT DOCUMENTS

| | | | |
|---|---|---|---|
| JP | 2012-0207238 A | 10/2012 | |
| JP | 2012246156 A | * 12/2012 | ............ C30B 29/42 |
| JP | 2015-010257 A | 1/2015 | |

(56) References Cited

FOREIGN PATENT DOCUMENTS

| | | |
|---|---|---|
| TW | 200712230 A | 4/2007 |
| TW | 201102449 A | 1/2011 |
| TW | 201339336 A | 10/2013 |

OTHER PUBLICATIONS

PCT International Search Report and Written Opinion dated Feb. 10, 2017 for PCT/IB2016/001196, filed Aug. 19, 2016.
Taiwan Search Report (English Translation) for 105125186 dated Sep. 2, 2017, 1 page.

* cited by examiner

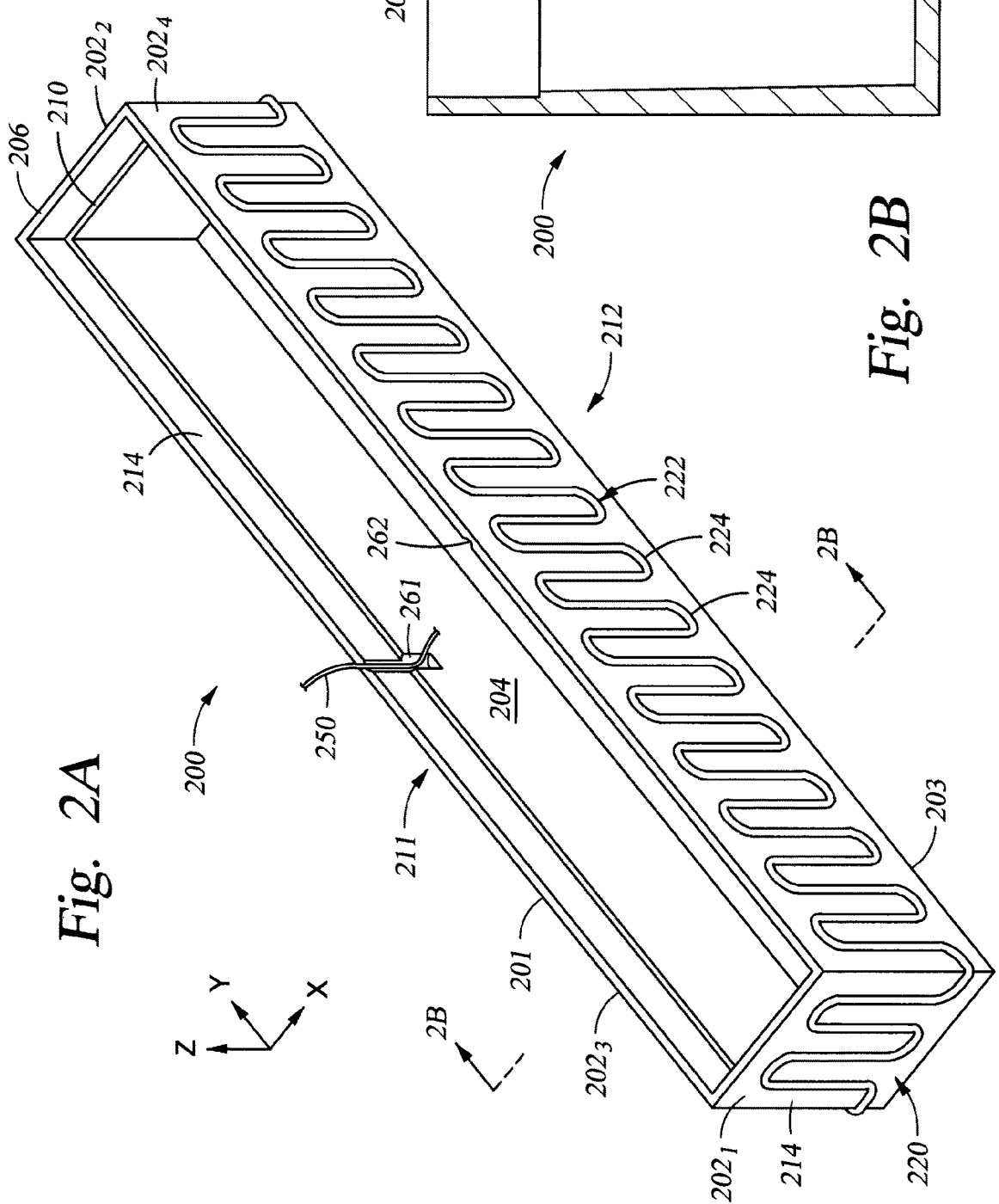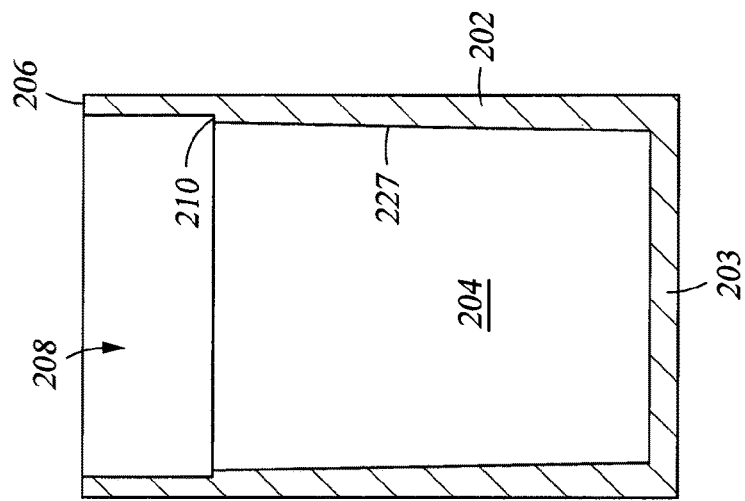

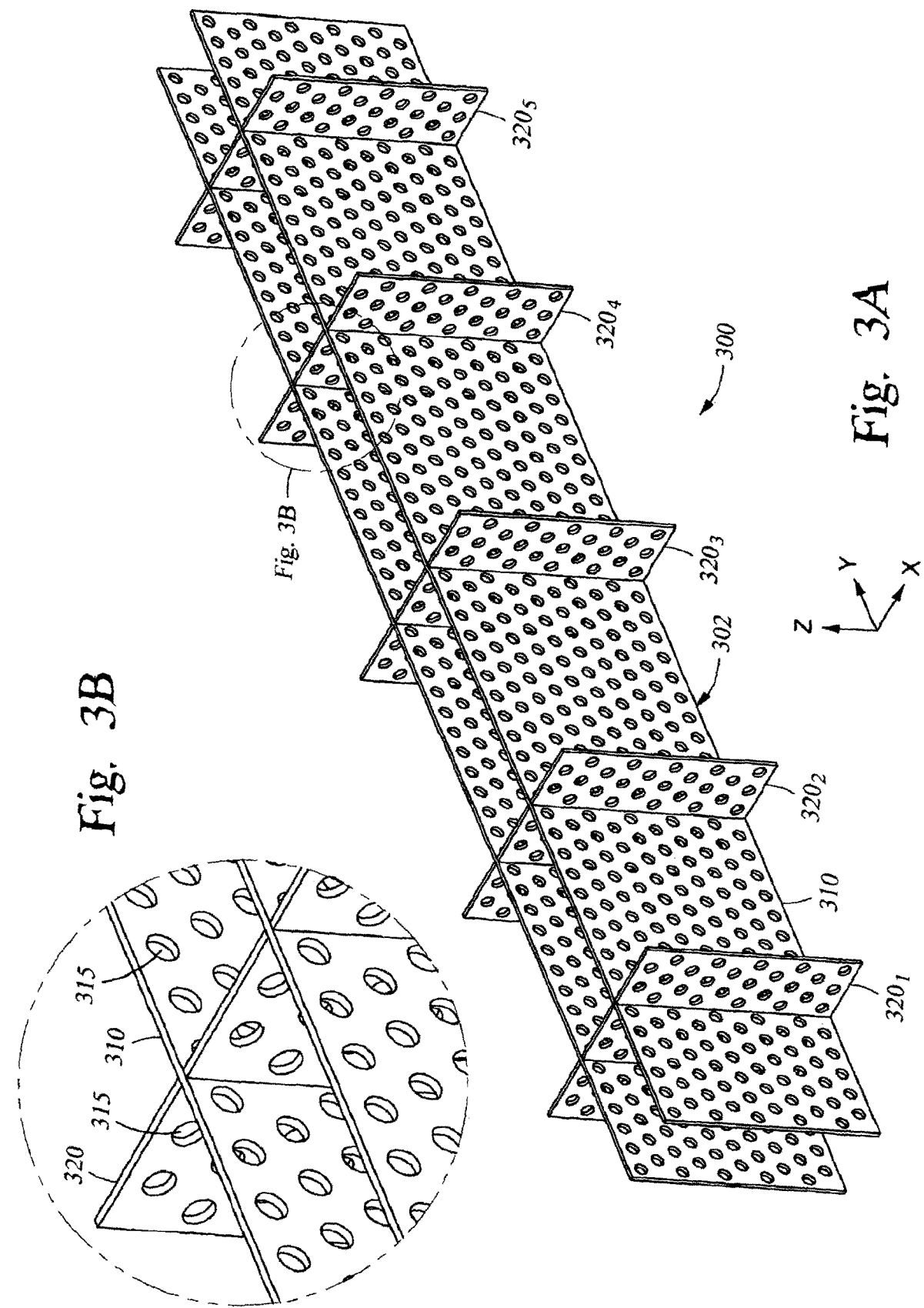

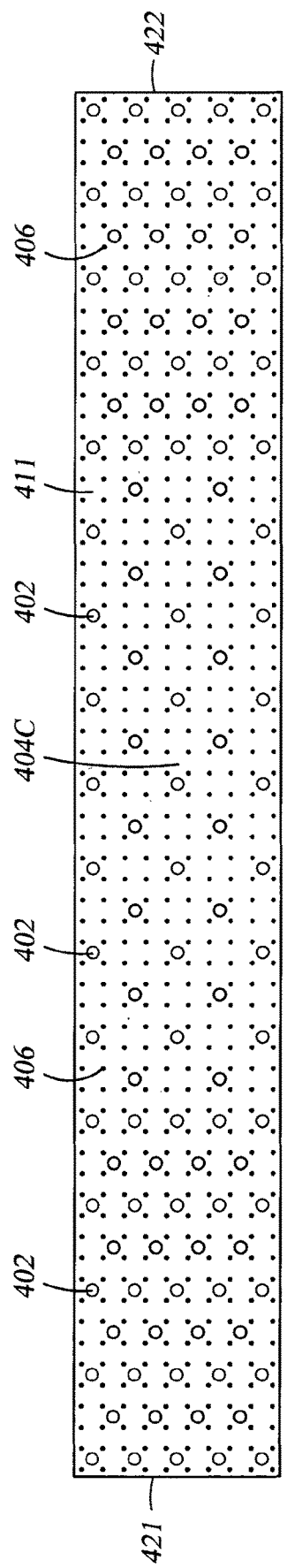
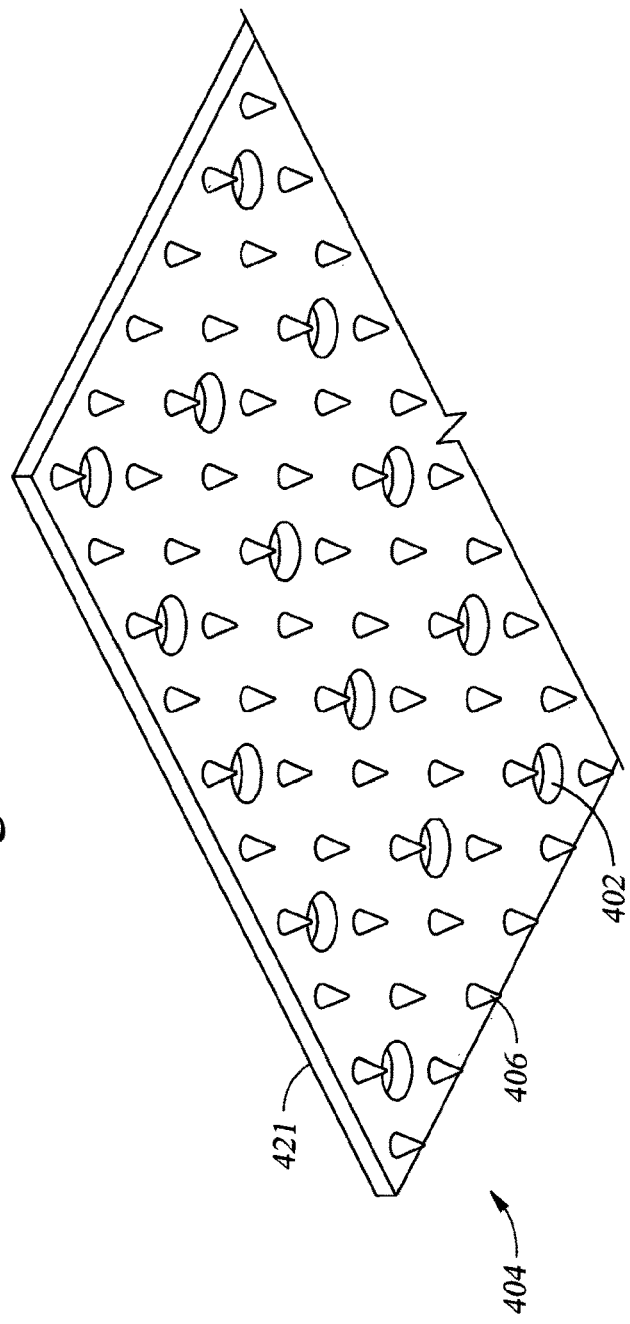
Fig. 4B
Fig. 4C

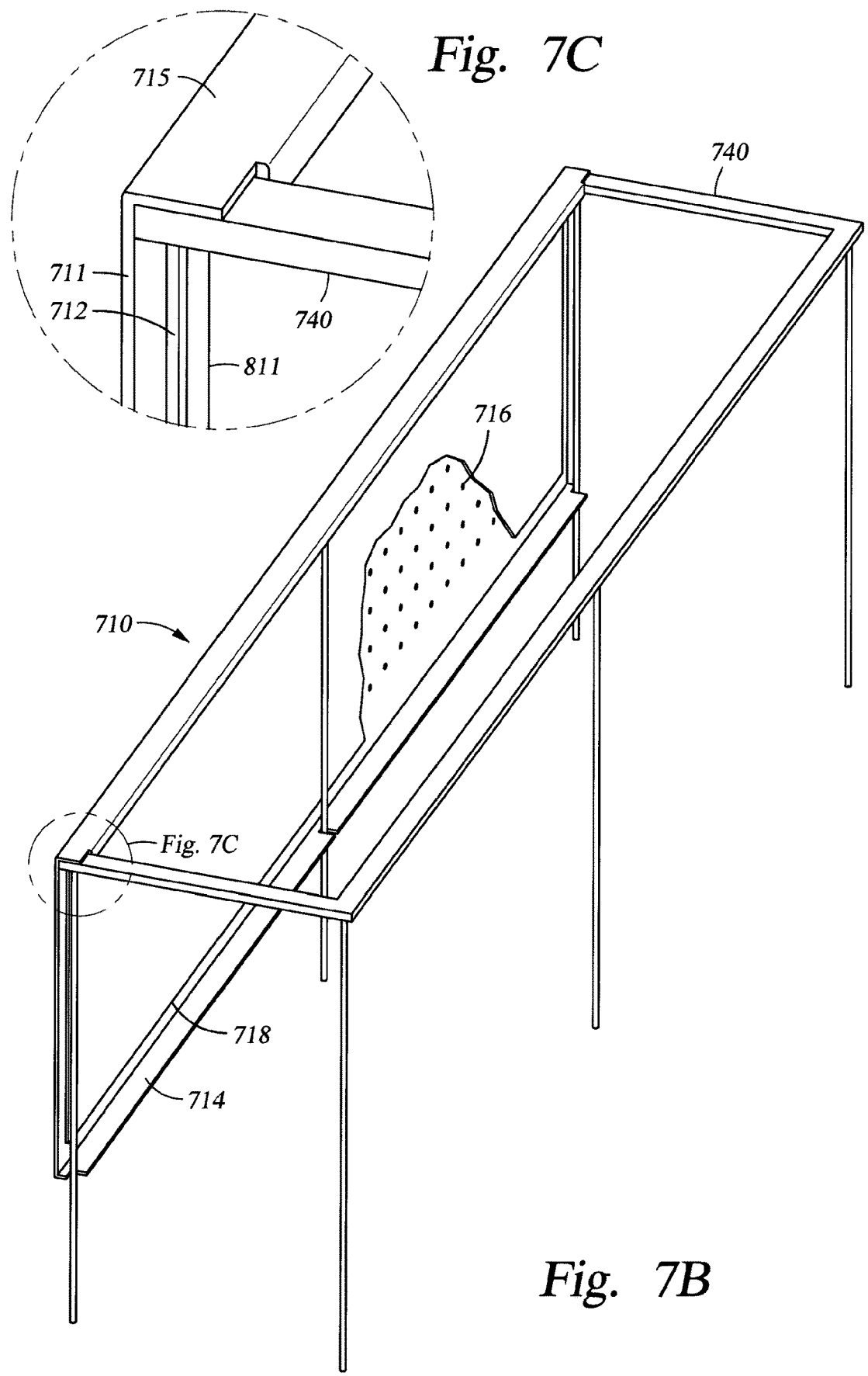

EVAPORATION SOURCE

This application is a 371 National Phase Application of PCT Application No. PCT/IB62016/001142, filed Aug. 17, 2016, which claims benefit of United States Provisional Patent Application No. 62/208,417, filed Aug. 21, 2015, each of which are incorporated herein by reference in their entireties.

BACKGROUND

Field

Embodiments of the present disclosure generally relate to evaporation sources used for physical vapor deposition of material onto substrates, and more particularly to an apparatus and method of depositing a material using a physical vapor deposition process on large substrates in a vacuum environment.

Description of the Related Art

A roll-to-roll deposition process is commonly used to form CIGS (copper-indium-gallium-(di) selenide) solar cell devices. During processing, a flexible substrate is generally unwound from a roll and moved past a series of evaporation sources to deposit the different elements used to form the GIGS absorber layer of the solar cell. Each evaporation source includes a crucible to heat and vaporize source material that deposits onto the flexible substrate as the substrate moves past the evaporation source. Uniform deposition of the different elements is necessary to produce a high-quality CIGS solar cell. It can be challenging to control the evaporation rate of the source material during processing, which makes it difficult to obtain a uniform deposition across the length of the substrate as the substrate is moved past the evaporation source during processing. The evaporation rate of the source material is not easily measured, so it can be difficult to control the evaporation rate, especially when faced with changing conditions, such as thermal disturbances from other evaporation sources and a varying fill level of source material in the crucible during processing. It is also desirable during production to maintain a constant evaporation rate over a long duration such as several days, preferably one week. Therefore, there is a need for an evaporation source that can improve the deposition uniformity of source material on a substrate and provide this improvement over a long period of time.

Furthermore, cost of production is an ongoing concern for alternative forms of energy, such as solar cells, to make them more cost-competitive with more traditional forms of energy, such as fossil fuels. Therefore, there is a continuing need to lower the cost of production for CIGS solar cells.

SUMMARY OF THE DISCLOSURE

Embodiments of the present disclosure generally relate to evaporation sources used for vapor deposition of material onto substrates and more particularly for controlled coating of large substrates, such as vacuum deposition of selenium on flexible substrates. Embodiments of the present disclosure may thus provide an evaporation source for depositing a source material on a substrate, the evaporation source comprising a crucible comprising a base, a first plurality of walls surrounding an interior region of the crucible, the plurality of walls including a first end wall, a second end wall opposite to the first end wall, a first side wall, and a second side wall opposite to the first side wall, a supporting ridge extending inwardly towards the interior region from at least two of the first plurality of walls, a thermal distributor disposed in the interior region of the crucible below the supporting ridge, and a lid disposed on the supporting ridge, the lid comprising two or more adjacently positioned sheets, wherein each sheet comprises a plurality of openings formed therethrough, and the plurality of openings in each sheet are not aligned with the plurality of openings formed in an adjacently positioned sheet.

Embodiments of the present disclosure may further provide an evaporation source for depositing a source material on a substrate, the evaporation source comprising a crucible comprising a base, a first plurality of walls surrounding an interior region of the crucible, the plurality of walls including a first end wall, a second end wall opposite to the first end wall, a first side wall, and a second side wall opposite to the first side wall, a supporting ridge extending inwardly towards the interior region from the walls, a thermal distributor disposed in the interior region of the crucible below the supporting ridge, and a thermal sensor disposed in the interior region of the crucible below the support ridge and above the thermal distributor.

Embodiments of the present disclosure may further provide a vapor deposition system for depositing a source material on a substrate comprising a vacuum chamber including one or more walls for enclosing a processing region of the vapor deposition system. The vacuum deposition system further includes one or more evaporation sources disposed in the processing region, each evaporation source comprising a crucible having a base and a first plurality of walls surrounding an interior region of the crucible. The plurality of walls include a first end wall, a second end wall opposite to the first end wall, a first side wall, and a second side wall opposite to the first side wall. The crucible further includes a supporting ridge extending inwardly towards the interior region from at least two of the first plurality of walls. A thermal distributor is disposed in the interior region of the crucible below the supporting ridge. A lid is disposed on the supporting ridge, the lid including two or more adjacently positioned sheets, wherein each sheet comprises a plurality of openings formed therethrough, and the plurality of openings in each sheet are not aligned with the plurality of openings formed in an adjacently positioned sheet.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a perspective view of a crucible assembly to be used in the evaporation source of FIG. 1B, according to one embodiment.

FIG. 2B is a side cross-sectional view of a crucible of the crucible assembly of FIG. 2A, according to one embodiment.

FIG. 3A is a perspective view of a thermal distributor to be used in the evaporation source of FIG. 1B, according to one embodiment.

FIG. 3B is a close-up sectional view of a portion of the thermal distributor of FIG. 3A, according to one embodiment.

FIG. 4B is a top view of a single sheet of the lid assembly of FIG. 4A, according to one embodiment.

FIG. 4C is a close-up sectional view of the single sheet of the lid assembly shown in FIG. 4B, according to one embodiment.

FIG. 7B is a perspective sectional view of a side wall portion and a portion of the frame of the heat shield assembly shown in FIG. 7A, according to one embodiment.

FIG. 7C is a close-up sectional view of a portion of FIG. 7B, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments. However, it should be understood that the disclosure is not limited to specific described embodiments. Instead, any combination of the following features and elements, whether related to different embodiments or not, is contemplated to implement and practice the claimed subject matter. Furthermore, although embodiments described herein may achieve advantages over other possible solutions and/or over the prior art, whether or not a particular advantage is achieved by a given embodiment is not limiting of the claimed subject matter. Thus, the following aspects, features, embodiments and advantages are merely illustrative and are not considered elements or limitations of the appended claims except where explicitly recited in a claim(s).

Embodiments of the present disclosure generally relate to evaporation sources used for physical vapor deposition of material onto substrates and more particularly for controlled coating of large substrates, such as vacuum deposition of selenium on flexible substrates. Said evaporation sources may, for example, be used within vacuum chambers where a plurality of evaporation source types, some of which may have physical and design characteristics different from the evaporation source 100 described below, are configured to implement a co-evaporation process.

Figure 1A:
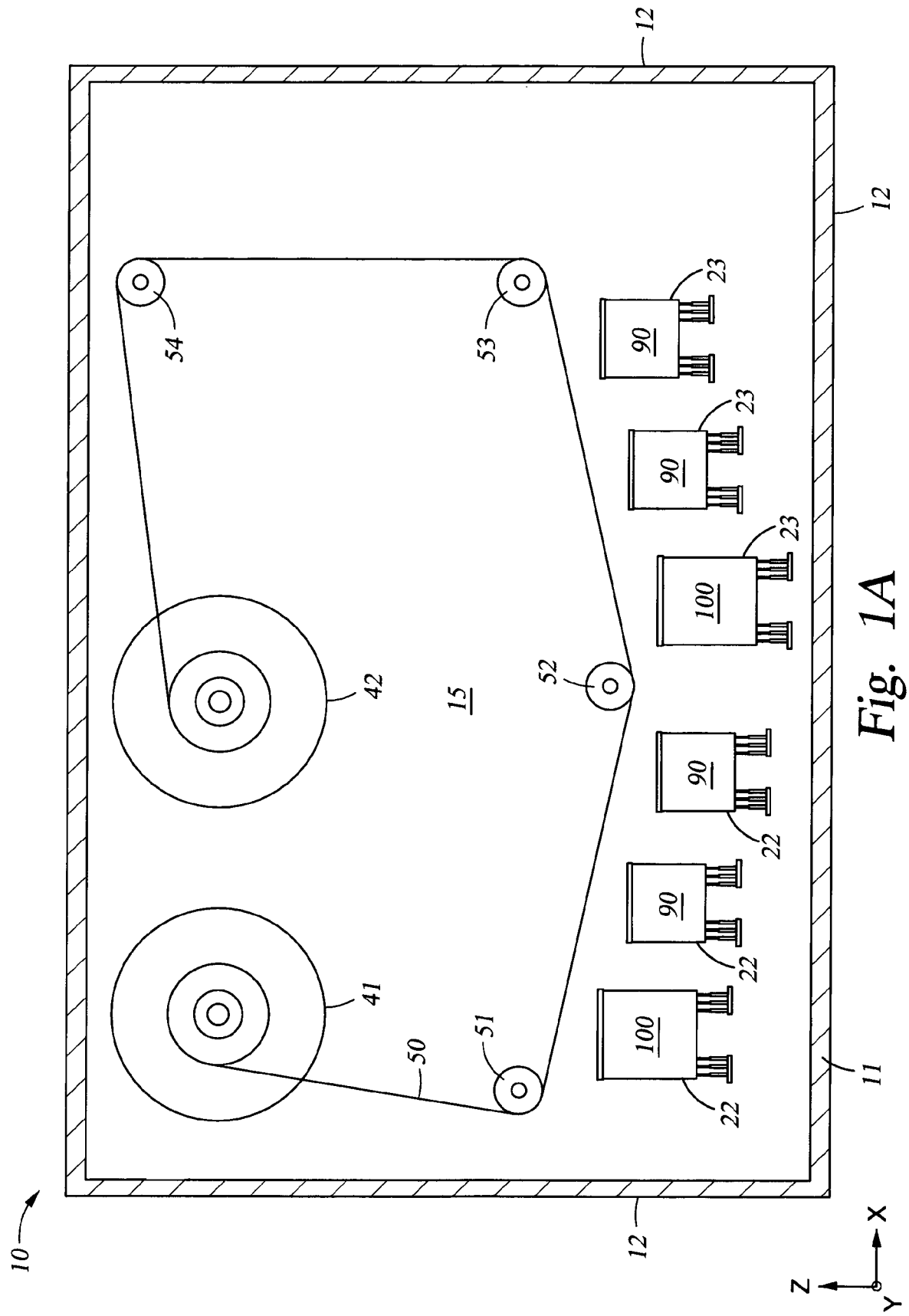
FIG. 1A is a side cross-sectional view of a vapor deposition system according to one embodiment.

FIG. 1A is a side cross-sectional view of a vapor deposition system 10 according to one embodiment. While not intending to limit the scope of the disclosure provided herein, in one embodiment, the vapor deposition system 10 is a roll-to-roll type vapor deposition system for depositing material layers onto a flexible substrate 50. The vapor deposition system 10 includes a vacuum chamber 11 including one or more walls 12 for enclosing a processing region 15 of the vapor deposition system 10. The vapor deposition system 10 can further include one or more evaporation sources 90 and one or more evaporation sources 100, which are both disposed within the processing region 15. The evaporation sources 90 may be used to deposit materials, such as copper (Cu), indium (In), and gallium (Ga). The evaporation sources 100 may be used to deposit materials that evaporate at a substantial rate below about 600° C. at the vacuum pressure maintained within vacuum chamber 11, such as selenium (Se), tellurium (Te), cadmium (Cd), or Zinc (Zn).

Typically, the processing region 15 of the vacuum chamber 11 is maintained at a constant vacuum pressure, such as about $2 \times 10^{-3}$ Pa. The vapor deposition system 10 includes one or more sets 22, 23 of two or more evaporation sources 90, 100 that are positioned within the processing region 15 to deposit material layer(s) onto the substrate 50 as the substrate 50 is transferred through the processing region 15. In some embodiments, the substrate 50 can include a web of flexible polyimide or stainless steel material. The substrate 50 can be transferred through the processing region 15 from a feed roll 41, over tensioning rolls 51, 52, 53, 54 and to a take-up roll 42.

The evaporation sources 90, 100 can each contain material that can be heated to a molten state, so that the heated material evaporates to coat portions of the substrate 50 as the substrate 50 passes near each evaporation source 90, 100. The sets 22 and 23 of evaporation sources 90, 100 may be oriented so as to follow the path of the substrate 50 through the processing region 15.

A person of ordinary skill in the art will recognize that any appropriate material may be deposited on a substrate using the vapor deposition system 10. The vapor deposition system 10 is particularly appropriate for deposition of materials to create photovoltaic cells, particularly CIGS (copper-indium-gallium-(di)selenide) solar cells. In one example, at least one CIGS-containing semiconductive photovoltaic layer, also known as the absorber layer, is deposited onto a portion of the substrate 50. The semiconductive photovoltaic layer may, for example, be made of an "ABC" material, wherein "A" represents elements in group 11 of the periodic table of chemical elements (e.g., copper (Cu) or silver (Ag)), "B" represents elements in group 13 of the periodic table (e.g., indium (In), gallium (Ga), or aluminum (Al)), and "C" represents elements in group 16 of the periodic table (e.g., sulfur (S), selenium (Se), or tellurium (Te)). An example of an $ABC_2$ material is the $Cu(In,Ga)Se_2$ semiconductor also known as a CIGS material. Other thin-film absorber materials include cadmium telluride (CdTe) and its variants, perovskites, amorphous silicon, thin-film silicon, as well as absorber materials used to manufacture dye-sensitized solar cells or organic solar cells.

Figure 1B:
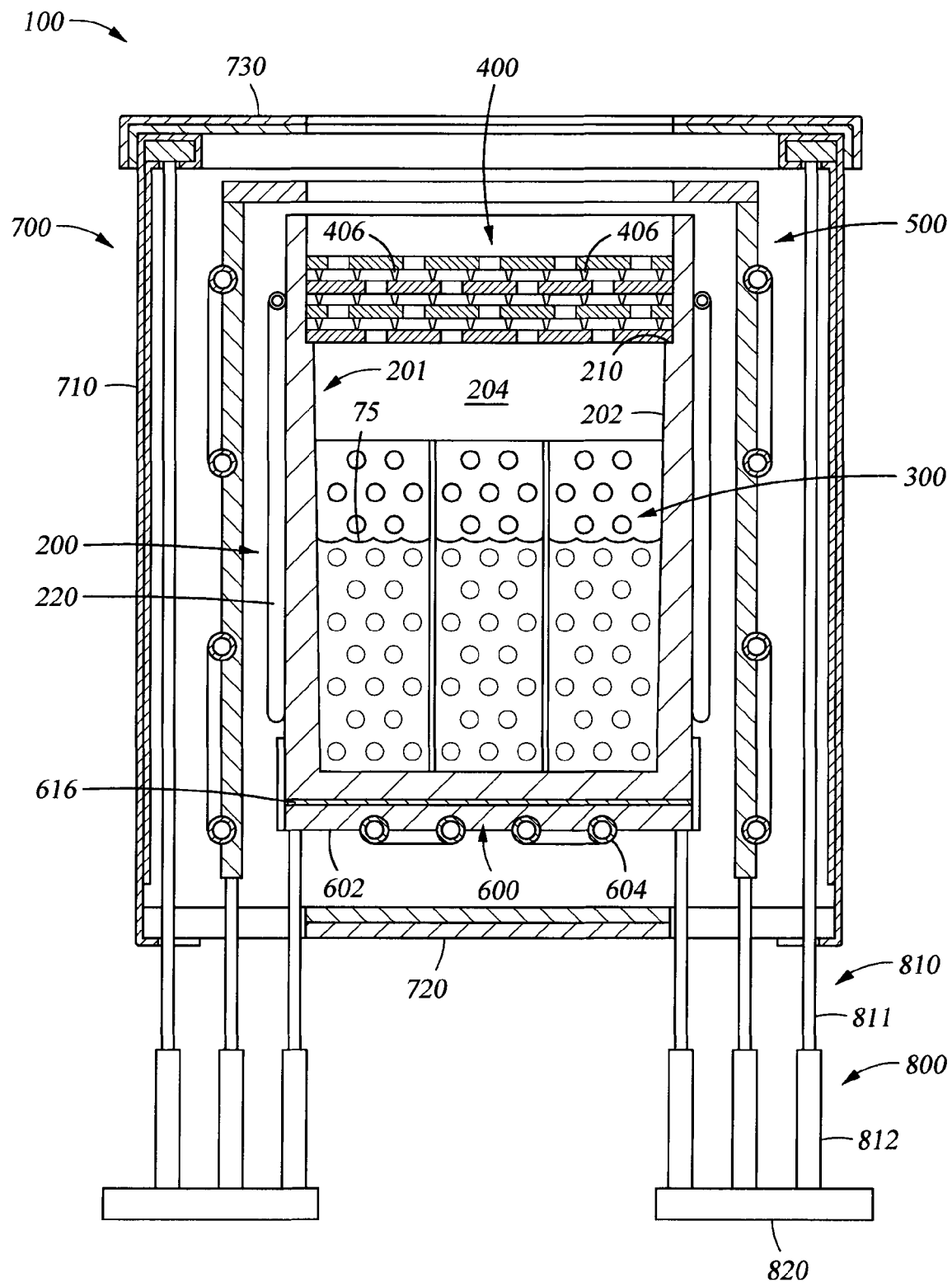
FIG. 1B is a side cross-sectional view of an evaporation source to be used in the vapor deposition system of FIG. 1B, according to one embodiment.

FIG. 1B is a side cross-sectional view of one of the evaporation sources 100, according to one embodiment. In one configuration, the evaporation source is used as a selenium evaporation source, but the evaporation source 100 may also be used as an evaporation source for other materials, such as a conductive or dielectric material, such as tellurium (Te), cadmium (Cd), Zinc (Zn), or other useful material.

The evaporation source 100 includes a crucible assembly 200 that includes a crucible 201 and heater 220. The heater 220 provides heat to melt and evaporate the deposition material 75 (e.g., selenium) in an interior region 204 of the crucible 201 during processing. The crucible assembly 200 is described in further detail below in reference to FIGS. 2A and 2B.

The evaporation source 100 further includes a thermal distributor 300 disposed within the interior region 204 of the crucible 201. The thermal distributor 300 is used to uniformly distribute heat to the deposition material 75 during processing. The thermal distributor 300 is described in further detail below in reference to FIGS. 3A and 3B.

The evaporation source 100 further includes a lid assembly 400 disposed above the thermal distributor 300. The lid assembly 400 can be positioned on a supporting ridge 210 of the crucible 201. The lid assembly 400 thermally isolates the interior region 204 of the crucible 201 from the areas above the crucible 201. The lid assembly 400 includes openings 402 (see FIG. 4A) to direct evaporated deposition material towards the substrate 50 (see FIG. 1A) during processing. In one configuration, the openings 402 are sized to control the effusion of material from the evaporation source 100. In one example, the opening diameters are between about 1 and about 5 millimeters (mm) in size, and are spaced a distance between about 10 and about 100 mm apart. The lid assembly 400 is described in further detail below in reference to FIGS. 4A, 4B, and 4C.

The evaporation source 100 further includes a thermal isolation assembly 500 disposed around one or more of the walls 202, such as all of the walls 202 of the crucible 201. The thermal isolation assembly 500 isolates the walls and top of the crucible 201 from variations in thermal loads coming from outside of the thermal isolation assembly 500, such as heat coming from one of the other evaporation sources 100 in the vacuum chamber 11. The thermal isolation assembly 500 is described in further detail below in reference to FIG. 5.

The evaporation source 100 further includes a cooling assembly 600. The cooling assembly 600 includes a cooling plate 602 disposed below the crucible 201. The cooling plate 602 can be used too rapidly cool the deposition material 75 when processing is completed or stopped. The cooling assembly 600 may further include one or more cooling tubes 604. In some embodiments, a sheet 616 material having a high thermal conductivity, such as graphite, may be disposed between the cooling plate 602 and the crucible 201 to further promote thermal contact between the cooling plate 601 and the crucible 201. The sheet 616 may also help provide some temperature regulation and control of the crucible 201. The cooling assembly 600 is described in further detail below in reference to FIGS. 6A and 6B.

The evaporation source 100 further includes a heat shield assembly 700 disposed around the thermal isolation assembly 500 and the cooling assembly 600 to further prevent external heat loads from causing thermal disturbances within the interior region 204 of the crucible 201. The heat shield assembly 700 includes one or more side wall portions 710, one or more base portions 720, and a lid portion 730. The heat shield assembly 700 is described in further detail below in reference to FIGS. 7A-7D.

The evaporation source 100 uses a modular design to simplify cleaning and other maintenance procedures that are commonly required when using physical vapor deposition sources. For example, the crucible assembly 200, the thermal isolation assembly 500, and the heat shield assembly 700 are all spaced apart and/or separable from each other allowing maintenance to be performed on one of these assemblies without disturbing the other assemblies. Furthermore, the lid assembly 400 and the lid portion 730 of the heat shield assembly are easily removable as described below, which allows easy access to the interior region 204 of the crucible 201.

The evaporation source 100 further includes a leg assembly 800. The leg assembly 800 provides support for other assemblies within the evaporation source 100, such as the thermal isolation assembly 500, the cooling assembly 600, and the heat shield assembly 700. Adjustment and positioning of the leg assembly 800 also determines where the evaporation source 100 is positioned within the vacuum chamber 11. In some embodiments, the feet 820 of the leg assembly 800 are positioned on a portion of the wall 12 of the vapor deposition system 10. In one configuration, the leg assembly 800 includes a plurality of legs 810 and a plurality of feet 820 that are used to level and vertically position the evaporation source 100 relative to the substrate 50 and thermally isolate the evaporation source 100 from portions of the vapor deposition system 10. In one example, the leg assembly 800 may include between about four feet 820 to about ten feet 820 that are positioned to evenly support the evaporation source 100. Each foot 820 may be connected to one to about eight legs 810, such as five legs 810. Each leg 810 includes an upper element 811 and a lower element 812 that are attached to each other. The upper element 811 is also attached to one of the assemblies, such as the thermal isolation assembly 500, the cooling assembly 600, or the heat shield assembly 700. In one embodiment, the upper element 811 has external threads (not shown) at either end (i.e., top and bottom in FIG. 1B) for connecting to the internal threads (not shown) formed on the lower element 812 and a portion of one of the assemblies 500, 600 or 700. The height of the assemblies 500, 600 or 700 can be adjusted by varying the amount that the upper element 811 is threaded into the lower element 812. The lower element 812 has a larger diameter than the upper element 811. The lower element 812 of each leg 810 is attached to one of the feet 820, for example, by using external threads (not shown) on the lower element 812 to connect to internal threads (not shown) on the foot 820. Each foot 820 can be attached to the vacuum chamber 11.

FIG. 2A is a perspective view of the crucible assembly 200, according to one embodiment. As described above, the crucible assembly 200 includes the crucible 201 and the heater 220 disposed around the walls 202 of the crucible 201. The crucible 201 can be formed of a material having high-thermal conductivity, such as molybdenum, graphite or stainless steel. The crucible 201 includes one or more walls 202, such as a plurality of walls 202, and a base 203. The plurality of walls 202 surround the interior region 204 of the crucible 201. The crucible 201 includes an opening 208 (see FIG. 2B) above the interior region 204 of the crucible 201.

In some embodiments, the crucible 201 can have a shape, substantially similar to a rectangular prism having an open top. An evaporation source 100 having a crucible 201 with a substantially rectangular shape, such as the crucible 201, is referred to herein as a linear evaporation source. In these embodiments, the walls 202 of the crucible 201 can include a first end wall $202_1$, a second end wall $202_2$ opposite to the first end wall $202_1$, a first side wall $202_3$, and a second side wall $202_4$ opposite to the first side wall $202_3$. The first side wall $202_3$ connects the first end wall $202_1$ to the second end wall $202_2$ along a first side 211 of the crucible 201. The second side wall $202_4$ connects the first end wall $202_1$ to the second end wall $202_2$ along a second side 212 of the crucible 201. The side walls $202_3$, $202_4$ each have a horizontal length (Y-direction in FIG. 2A) extending in a direction from the first end wall $202_1$ to the second end wall $202_2$. The end walls $202_1$, $202_2$ each have a horizontal length (X-direction in FIG. 2A) extending in a direction from the first side wall $202_3$ to the second side wall $202_4$. The side walls $202_3$, $202_4$ generally have a horizontal length that is longer than the length of the end walls $202_1$, $202_2$. For example, in some embodiments, the side walls $202_3$, $202_4$ have a horizontal length from about 50 mm to about 5000 mm (e.g., about 1120 mm), and the end walls $202_1$, $202_2$ have a horizontal length from about 20 mm to about 300 mm (e.g., about 96 mm). In some embodiments, a ratio of the length of the side walls $202_3$, $202_4$ to the horizontal length of the end walls $202_1$, $202_2$ is from about 5:1 to about 500:1. In some embodiments, the horizontal length of the sidewalls $202_3$, $202_4$ is related to the width of the substrate 50 (see e.g., the dimension of the substrate 50 in the Y-direction of FIG. 1A). For example, the horizontal length of the side walls $202_3$, $202_4$ may be longer than the width of the substrate 50 in the Y-direction by about 1 mm to about 250 mm, such as about 120 mm. Furthermore, in some embodiments, the end walls $202_1$, $202_2$ and the side walls $202_3$, $202_4$ each have a height (i.e., in the Z-direction of FIG. 2A) from about 30 mm to about 700 mm, such as about 150 mm.

The crucible 201 further includes the ridge 210 for supporting the lid assembly 400 (see FIG. 1B) as described above. The ridge 210 extends at least along two of the opposing side walls $202_3$, $202_4$, and in some embodiments around each of the walls 202 of the crucible 201. For embodiments (not shown) presenting a cylindrical symmetry, such as a bowl-shaped crucible, the ridge 210 may extend along the entire inner periphery of the wall 202 of that crucible. The ridge 210 is positioned at a vertical location (Z-direction in FIG. 2A) between the thermal distributor 300 (see FIG. 1B) and the top 206 of the crucible 201. Having the ridge 210 positioned above the thermal distributor 300 ensures that the molten deposition material 75 does not contact the lid assembly 400 because the fill level of the molten deposition material 75 is kept below the top of the thermal distributor 300 and because the lid assembly 400 does not extend below the ridge 210. Having a ridge 210 along the entire inner periphery of the crucible 201 ensures that, when lid assembly 400 is in position, there is no direct evaporation path to locations outside the crucible 201 that bypasses the sheets 404 of the lid assembly 400 described below.

The crucible 201 can further include at least one first groove 261 for allowing placement of at least one thermal sensor 250, such as a thermocouple. The first groove 261 extends from the top 206 of the crucible 201 down to a vertical location on one of the walls 202 below the ridge 210 and above the thermal distributor 300 (see FIG. 1B). The first groove 261 may be located, for example, at a center position along the length direction (Y-direction of FIG. 2A) of one of the side walls $202_3$, $202_4$. The first groove 261 allows the thermal sensor 250 to be routed from outside the crucible 201 to the interior region 204 of the crucible 201 without impeding the positioning of the lid assembly 400 on the ridge 210. The thermal sensor 250 may be routed to avoid thermal contact with the lid assembly 400, so that the lid assembly 400 does not interfere with measurements made by the thermal sensor 250.

The thermal sensor 250 can extend inwardly toward the interior region 204 of the crucible 201 from the first groove 261 at a vertical location below the ridge 210 and above the thermal distributor 300, so that the thermal sensor 250 remains above the molten deposition material 75 during processing. For example, the thermal sensor 250 can extend inwardly at vertical location from about 1 mm to about 20 mm below the ridge 210, such as about 10 mm below the ridge 210. The vertical location of the ridge 210 can also correspond to the lowest position of the lid assembly 400 (see FIG. 1B), so that a vertical distance between the thermal sensor 250 and the ridge 210 corresponds to a vertical distance between the thermal sensor 250 and the lid assembly 400.

Thus, the thermal sensor 250 measures a temperature of the vapor of the deposition material 75 during processing. Measuring the temperature of the vapor of the deposition material 75 will allow a temperature control system to accurately and consistently determine the temperature of the surface of the molten deposition material 75, which is used to control the evaporation rate of the molten deposition material 75. Thus, by measuring the temperature of the vapor of the deposition material 75, the temperature control system (not shown) can be used to adjust the power supplied to the heater 220 to control the evaporation rate of the deposition material 75. Accurate control of the evaporation rate of the deposition material 75 leads to better control of the deposition rate, and also provides a more uniform deposition of the deposition material 75 across the substrate 50, which improves product quality and yield.

Conversely, placing a thermal sensor, such as a thermocouple in the deposition material 75 causes numerous problems. First, the evaporation rate is more dependent on the temperature at the surface of the deposition material 75 than a temperature at some depth of the deposition material 75, so controlling the temperature at a given depth of the deposition material provides inadequate control of the deposition rate. Second, this thermal sensor can become exposed as the fill level of the deposition material decreases during processing, which drastically alters the thermal environment of the thermocouple leading to measurements that are not useful for controlling the deposition rate of the deposition material 75. Third, servicing of the thermocouple is much more difficult when the thermocouple is surrounded by the deposition material 75 that has solidified after use.

The temperature control system is generally used to control one or more components found in the vapor deposition system 10. The temperature control system is generally designed to facilitate the control and automation of the components within the vapor deposition system 10 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and control support hardware (e.g., sensors, motors, evaporation sources, heaters, etc.), and monitor the processes performed in the system (e.g., substrate support temperature, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the temperature control system determines which tasks are performable on a substrate in the vapor deposition system 10. Preferably, the program is software readable by the temperature control system that includes code to perform tasks relating to monitoring, execution and control of the movement, support, and/or positioning of a substrate along with the various process recipe tasks and various chamber process recipe steps being performed in the temperature control system (e.g., temperature control of the evaporation source 100).

The crucible 201 may further include a second groove 262 for allowing placement of a level sensor (not shown), such as a resistance depth probe. In one embodiment, the second groove may be placed on the opposing side wall (e.g., side wall $202_4$) from the side wall (e.g., side wall $202_3$) including the thermal sensor 250. In one embodiment, a resistance depth probe (not shown) extends into the molten deposition material 75 during processing to measure the varying level of the molten deposition material 75.

The heater 220 can include a heating cable 222, such as a sheathed heating cable. The heating cable 222 can be distributed across each of the walls 202 in a pattern using a plurality of loops 224. Portions of the heating cable 222 at a given vertical location (i.e., Z-position in FIG. 2A) may be separated from other portions of the heating cable 222 at the same vertical location by about 8 mm to about 50 mm, such as by about 20 mm. Each loop 224 can extend from a location close to the base 203 of the crucible 201 to a location close to the top 206 of the crucible 201. For example, in some embodiments the change in height (e.g., the amplitude) of the heating cable 222 in each loop covers a vertical distance of at least 60% of the height of the walls 202, such as at least 90% of the height of the walls 202. The loops 224 allow thermal expansion of the heating cable 222 with respect to the crucible 201. Electric power may be applied to the heating cable 222 to provide the heat to the crucible 201 by a power supply that is coupled to the temperature control system. The heating cable 222 may be secured to the walls 202 of the crucible 201 using mechanical elements, for example, clamps (not shown) that can be fastened to the walls 202 of the crucible 201. In some embodiments, the crucible assembly 200 can further include one or more sheets 214 of material having a high thermal conductivity, such as graphite, disposed between heating cable 222 and the one or more walls 202 of the crucible 201 to promote heat transfer between the heater 220 and the crucible 201. The one or more sheets 214 can be secured using the same clamps and fasteners used to secure the heating cable 222 to the walls 202 of the crucible 201.

FIG. 2B is a side cross-sectional view of the crucible 201 taken along the line 2B of FIG. 2A, according to one embodiment. In some embodiments, one or more of the walls 202 of the crucible 201 may include a tapered portion 227 between the base 203 and the ridge 210 of the crucible 201. In some embodiments, the tapered portion 227 extends the entire vertical distance (Z-direction) from the base 203 to the ridge 210. The tapered portion 227 may be angled outwardly from the base 203 by about 0 degrees to about 5 degrees from a vertical direction, such as by about 2 degrees to about 4 degrees. Including a tapered portion 227 on the lower part of the walls 202 allows for the relief of the intrinsic or extrinsic stress created by the melting or solidifying of the evaporation material on the crucible walls 202 when the deposition material 75 is heated or cooled. For example, selenium has a coefficient of thermal expansion of 37E-6 m/m*K, and the expansion of heated selenium can cause significant stress on the walls 202 of the crucible 201 before melting. Furthermore, because the angle of the tapered portion 227 is only from about 0 degrees to about 5 degrees, the surface area of the exposed surface of the molten deposition material 75 does not change substantially with the fill level of deposition material 75. One will note that the evaporation rate of the deposition material 75 is largely affected by the surface area of the exposed surface of molten deposition material 75, and the temperature of the vapor of the deposition material 75. Thus, having the exposed surface area of the molten deposition material 75 remain relatively constant despite changes in fill level allows the evaporation rate of deposition material 75 to be more easily controlled by controlling the temperature, for example by using measurements from the thermal sensor 250 described above.

In some embodiments, the tapered portion 227 has a greater thickness at the base 203 than at higher vertical locations, such as the ridge 210. For example, the tapered portion 227 may have a thickness from about 6 mm to about 100 mm at the base 203 and thickness from about 4 mm to about 60 mm at the ridge 210. Furthermore, the thickness of the walls 202 at the top 206 can be, for example, from about 2 mm to about 40 mm. The support ridge 210 can extend inwardly from the walls 202 by about 1 mm to about 20 mm. The portions of the walls 202 above the tapered portion 227, such as portions above the ridge 210 can be substantially vertical.

FIG. 3A is a perspective view of the thermal distributor 300 described above in reference to FIG. 1B, according to one embodiment. FIG. 3B is a close-up sectional view of a portion of the thermal distributor of FIG. 3A, according to one embodiment. The thermal distributor 300 is placed in the interior region 204 of the crucible 201 and is used to uniformly distribute heat to the deposition material 75 (see FIG. 1B) during processing. The thermal distributor 300 can be fabricated from a material that is heat-resistant, chemically compatible with the deposition material 75 and has a high thermal conductivity, such as refractory metals, such as molybdenum. The thermal distributor 300 can be sized in relation to interior region 204 of the crucible 201 to ensure good thermal contact between the thermal distributor 300 and the walls 202 of the crucible 201. The thermal distributor 300 includes a body 302 formed of one or more first portions 310 and one or more second portions 320. The first portions 310 can extend in a first direction (i.e., Y-direction in FIG. 3), such as the length direction of the side walls $202_3$, $202_4$. For embodiments including two or more first portions 310, the first portions 310 can be spaced apart in a second direction (i.e., the X-direction in FIG. 3) perpendicular to the first direction. The second portions 320 can extend in the second direction (i.e., X-direction in FIG. 3), such as the length direction of the end walls $202_1$, $202_2$. For embodiments including two or more second portions 320, the second portions 320 can be spaced apart in the first direction along the length of the first portions 310. In some embodiments, the first portions 310 can be joined to the second portions 320 to give the thermal distributor 300 a grid structure when viewed from above. In another embodiment (not shown), the thermal distributor may include a metal wool, for example molybdenum wool or stainless steel wool. In one embodiment, this metal wool may can be, for example, sandwiched between two grids.

In one example, the first portions 310 and the second portions 320 can be formed of molybdenum sheets having a thickness from about 0.2 mm to about 5 mm. For example, the first portions 310 can have a thickness in the X-direction of about 0.2 mm to about 5 mm. The first portions 310 and the second portions 320 can have a height (Z-direction in FIG. 3) of about 5 mm to about 500 mm, such as about 60 mm. The height of the portions 310, 320 can be set to be higher than the expected level of the deposition material 75 in the crucible 201.

For configurations that include multiple first portions 310, the first portions 310 extending in the first direction may be spaced apart in the second direction by about 10 mm to about 40 mm, such as about 20 mm. For embodiments including multiple second portions 320, the second portions 320 extending in the second direction may be spaced apart in the first direction by about 20 mm to about 160 mm, such as about 80 mm.

Each of the first portions 310 and the second portions 320 can also include a plurality of holes 315. During heating, convection allows the molten deposition material 75 to flow through the openings 304. The plurality of holes 315 may be distributed along the lengths of the first portions 310 and the second portions 320 in a repeating pattern. In one embodiment, the plurality of holes 350 can be arranged in a hexagonal close-pack pattern (e.g., one hole 350 surrounded by six holes 350). The holes 315 can have, for example, a diameter from about 2 mm to about 40 mm, such as about 6 mm. Furthermore, the holes 315 may be spaced apart from each other along the length of the given portion 310, 320 from about 4 mm to about 80 mm, such as about 12 mm. In some embodiments, the distance between the holes 315 along the lengths of the given portion 310, 320 is about twice the diameter of the holes 315.

The thermal distributor 300 can homogenize the surface temperature of the molten deposition material 75 during processing. The surface temperature of the molten deposition material 75 is what controls the evaporation rate and ultimately the deposition rate of the deposition material 75 onto the substrate 50. Many deposition materials, such as selenium, are poor thermal conductors, so using the thermal distributor 300 formed of a material having a high thermal conductivity allows the heat from the heater 220 to be uniformly distributed to the deposition material 75. The thermal distributor 300 having high thermal conductivity also aids in rapid cooling of the deposition material 75 after horizontal processing is completed.

In some embodiments, the spacing of the first portions 310 and second portions 320, relative to themselves, may be non-symmetric to assure that the thermal uniformity in the interior region 204 of the crucible 201 is uniform. For example, a spacing between the second portions 320 in a first region of the interior 204 can be shorter than the spacing between the second portions 320 in a second region of the interior 204, wherein the first region is closer to one of the end walls $202_1$, $202_2$ than the second region is to one of the end walls $202_1$, $202_2$. Furthermore, although not shown a spacing between the first portions 310 in a third region of the interior 204 can be shorter than the spacing between the first portions 310 in a fourth region, wherein the third region is closer to one of the side walls $202_3$, $202_4$ than the fourth region is to one of the side walls $202_3$, $202_4$.

Figure 4A:
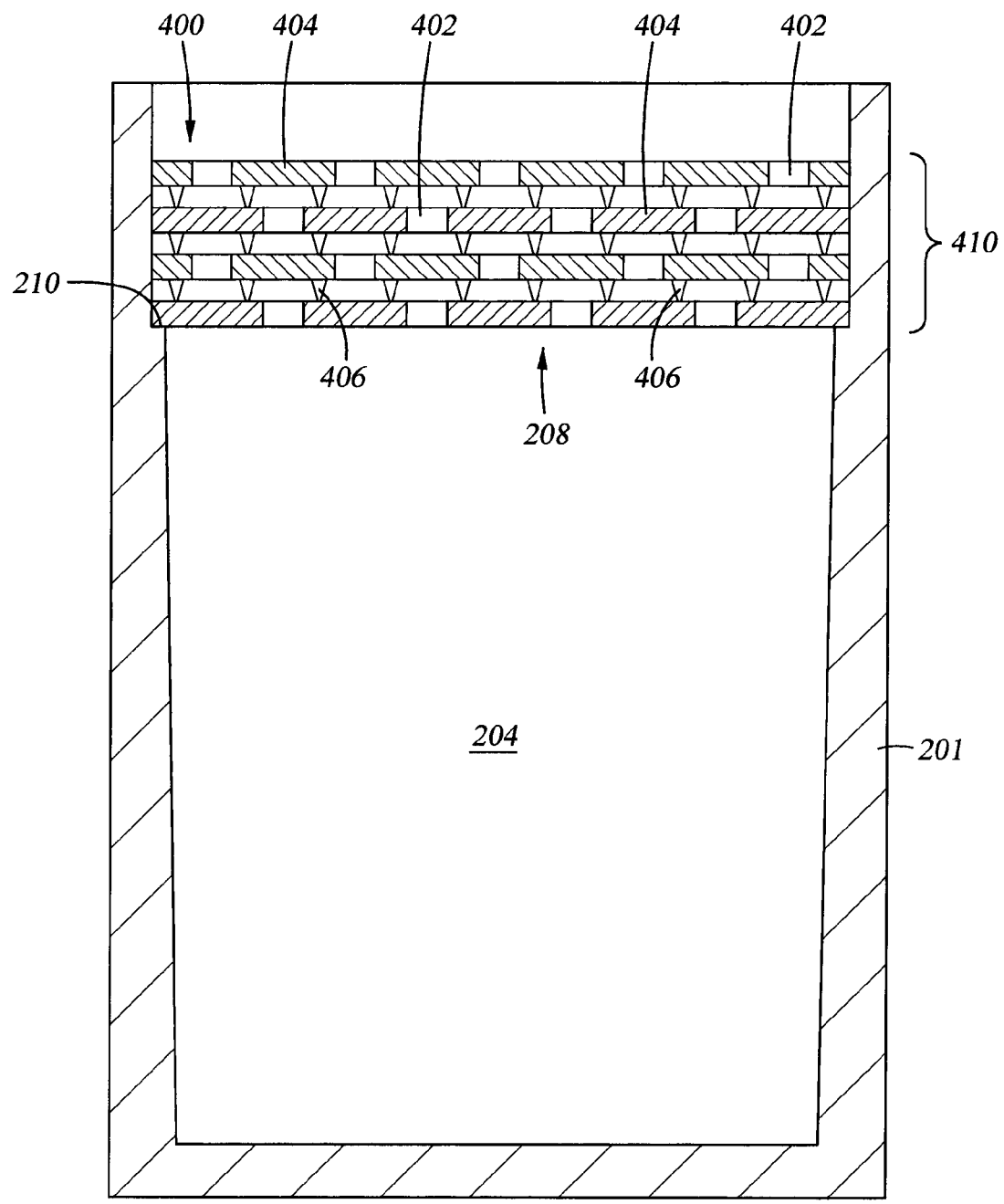
FIG. 4A is a side sectional view of a lid assembly mounted on an empty crucible, according to one embodiment.

FIG. 4A is a side sectional view of the lid assembly 400 mounted on an empty crucible 201, according to one embodiment. As described above, the lid assembly 400 includes openings 402 to direct evaporated deposition material 75 towards the substrate 50 during processing. The lid assembly 400 may be formed from a heat resistant and thermally conductive material, such as molybdenum or graphite. In some embodiments, the lid assembly 400 includes a stack 410 of a plurality of sheets 404 stacked on top of each other, such as from 2 to about 20 sheets, such as from 5 to 12 sheets, such as 10 sheets. In such embodiments, each sheet 404 includes a plurality of openings 402 to direct evaporated deposition material towards the substrate 50 during processing. The sheets 404 can be formed of molybdenum, such as sheets having a thickness in the vertical direction of FIG. 4A from about 0.1 mm to about 0.4 mm, such as about 0.2 mm. The lid assembly 400 may completely cover the opening 208 of the crucible 201.

FIG. 4B is a top view of a single sheet 404 of the lid assembly 400 of FIG. 4A, according to one embodiment. FIG. 4C is a close-up sectional view of a portion of the single sheet 404 of the lid assembly 400 shown in FIG. 4B, according to one embodiment. The sheets 404 may include bumps 406 distributed across at least one surface of the sheet 404 that includes the openings 402, such as a first surface 411. The first surface 411 may be a top surface or a bottom surface of the sheet 404. The bumps 406 create separation between the sheets 404 of the stack 410 to minimize thermal contact between the sheets 404 in the stack 410. In some embodiments, there can be as many bumps 406 as there are openings 402. In some embodiments, each bump 406 can have a cross section that narrows as the bump extends away from the first surface 411. For example, FIG. 4A shows the bumps 406 having a triangular cross section extending from the sheets 404 to a point. FIG. 4C shows another view of the bumps 406 having a conical shape. Using bumps 406 with a cross section that narrows as the bumps 406 extends away from the first surface 411 of the sheet 404 reduces the amount of surface area contact between neighboring sheets 404, which reduces the heat transfer between the sheets 404.

In some embodiments, the number of openings 402 per unit area through the first surface 411 may vary along the length of the sheet 404 from a first end 421 to a second end 422. The length of the sheet 404 can be the same direction as the length of one of the side walls $202_3$, $202_4$ of the crucible 201 (see FIG. 2A). For example in one embodiment, the sheet 404 may include a higher concentration of openings 402 on regions of the first surface 411 that are closer to one of the ends 421, 422 than to a center 404C of the first surface 411. For example, a first region of the first surface 411 contacting one of the ends 421, 422 may include more openings 402 than a second region of the first surface 411 that covers the same area as the first region and includes the center 404C. Having a higher concentration of openings 402 through regions of the first surface 411 near the ends 421, 422 can enable a more homogeneous deposition of the deposition material 75 on the substrate 50. The higher concentration of openings 402 near the ends 421, 422 may help compensate for the tendency of a source with a lengthwise uniform nozzle to evaporate a greater flux of material towards its middle than towards its ends. Thus, there can be a higher flux of evaporated deposition material 75 through the lid assembly 400 for regions that are closer to the ends 421, 422 than for regions closer to the center 404C.

The openings 402 can have a diameter from about 0.5 mm to about 5 mm, such as 1 mm. In one embodiment, the openings 402 may be spaced apart from each other in a hexagonal pattern (e.g., one opening 402 surrounded by six other openings 402) across the first surface 411. The openings 402 may be spaced apart from each other by about 10 mm to about 100 mm, such as about 20 mm, in the width direction of the first surface 411 (i.e., the direction parallel to the ends 421, 422). The openings 402 may be spaced apart from each other by about 20 mm to about 200 mm, such as by about 40 mm, in the length direction of the first surface 411 (i.e., the direction perpendicular to the ends 421, 422).

Referring to FIG. 4A, the openings 402 of a given sheet 404 may be staggered relative to the openings 402 of the sheets 404 directly above and directly below the given sheet 404. Staggering the openings 402 prevents a line of sight through the stack 410 of sheets 404. A line of sight through the stack 410 of sheets 404 can cause heat shielding problems as well as problems associated with the distribution of the vapor of the deposition material 75. For example, the staggering helps to randomize the direction of the vapor of the deposition material 75, so that a more homogenous deposition on the substrate 50 is achieved. A higher number of sheets 404 can improve the heat shielding effects of the stack 410 relative to a lower number of sheets 404. The openings 402 of the topmost sheet 404 of the stack 410 can have the largest effect on the distribution of the vapor of the deposition material 75.

The lid assembly 400 is removable from the supporting ridge 210 of the crucible 201 allowing for the crucible 201 to be rapidly filled with deposition material 75 when the lid assembly 400 is removed. For example, selenium pellets may be poured into the crucible 201 when the lid assembly 400 is removed. Furthermore, having a lid assembly 400 that is easily removed allows for easy replacement of the lid assembly 400 with a different lid assembly, for example, a different lid assembly having a different distribution of openings that can be used for a different product.

Figure 5:
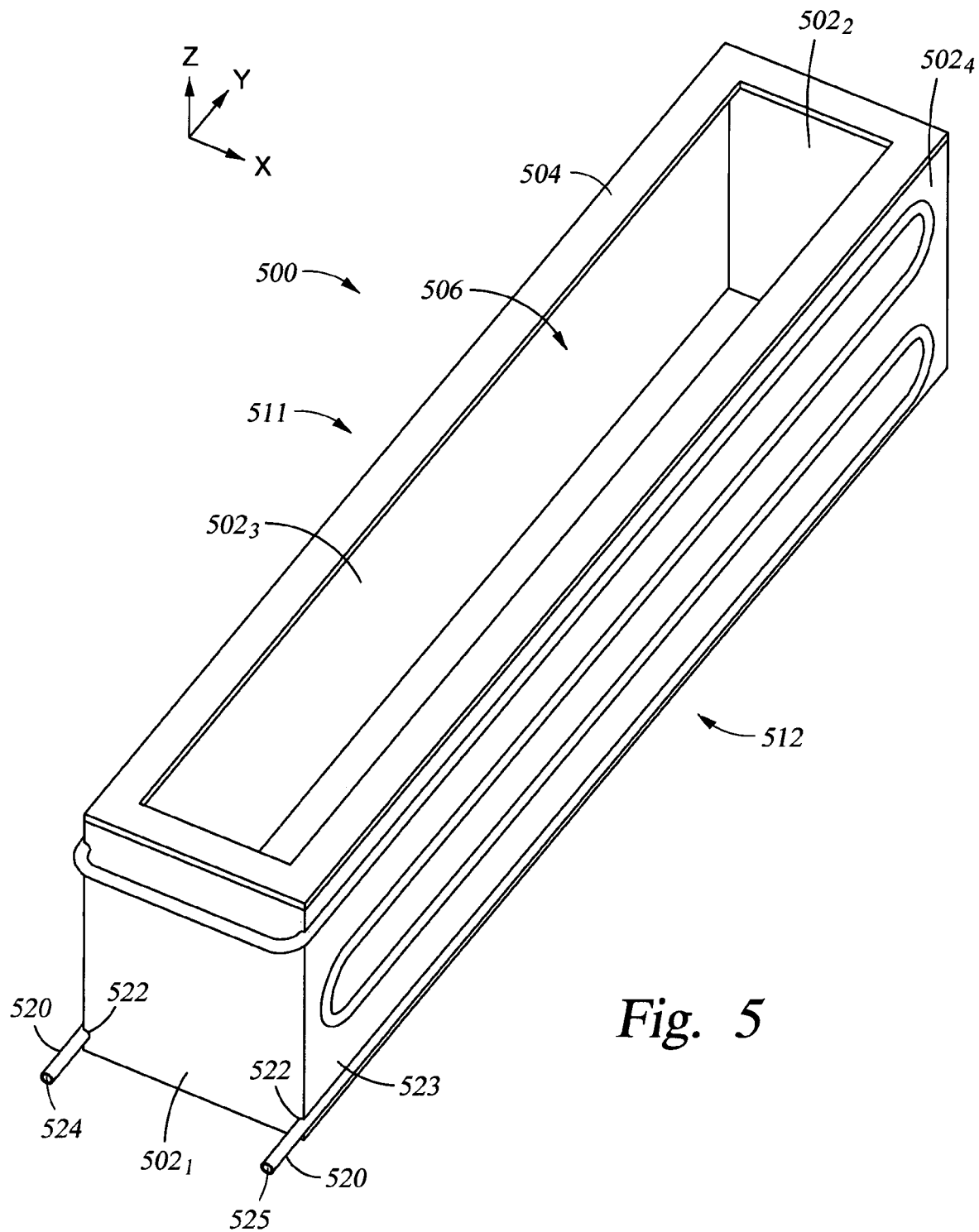
FIG. 5 is a perspective view of a thermal isolation assembly to be used in the evaporation source of FIG. 1B, according to one embodiment.

FIG. 5 is a perspective view of the thermal isolation assembly 500, according to one embodiment. The thermal isolation assembly 500 is generally used to isolate the crucible assembly 200 from external thermal loads found within the vapor deposition system 10. For example, without the thermal isolation assembly 500, the crucible assembly 200 would receive heat from other sources in the vacuum chamber 11, such as other evaporation sources. Furthermore, these other sources of heat would generally heat the crucible assembly 200 and the deposition material 75 in a non-uniform way, such as mainly near the end walls $202_1$, $202_2$. Typically, a single thermal sensor 250 has no way of measuring this non-uniformity. Furthermore, even if multiple thermal sensors were used to measure this non-uniformity, the heater 220 cannot heat in a way to remove these thermal non-uniformities. Consequently, prevention of these thermal non-uniformities by using the thermal isolation assembly 500 is a clear improvement over evaporation sources not including a thermal isolation assembly, such as the thermal isolation assembly 500. In some embodiments, the heat shield assembly 700 and the lid assembly 400 can each use heat-reflecting sheets, such as molybdenum sheets, which can further shield the crucible assembly 200 from external thermal loads.

Referring to FIGS. 1B and 5, the thermal isolation assembly 500 includes one or more vertical walls 502 and a top plate 504. The one or more vertical walls 502 can surround the crucible assembly 200. The one or more vertical walls 502 can include a first end wall $502_1$, a second end wall $502_2$ opposite to the first end wall $502_1$, a first side wall $502_3$, and a second side wall $502_4$ opposite to the first side wall $502_3$. The first side wall $502_3$ connects the first end wall $502_1$ to the second end wall $502_2$ along a first side 511 of the thermal isolation assembly 500. The second side wall $502_4$ connects the first end wall $502_1$ to the second end wall $502_2$ along a second side 512 of the thermal isolation assembly 500. The side walls $502_3$, $502_4$ each have a horizontal length extending in a direction from the first end wall $502_1$ to the second end wall $502_2$. The end walls $502_1$, $502_2$ each have a horizontal length extending in a direction from the first side wall $502_3$ to the second side wall $502_4$. The side walls $502_3$, $502_4$ generally have a horizontal length that is longer than the horizontal length of the end walls $502_1$, $502_2$. For example, in some embodiments, the side walls $502_3$, $502_4$ have a horizontal length from about 50 mm to about 5100 mm (e.g., about 1200 mm), and the end walls $502_1$, $502_2$ have a horizontal length from about 20 mm to about 400 mm (e.g., about 120 mm). The walls 502 can surround the crucible assembly 200 and can be spaced apart from a nearest part of the crucible assembly by about 4 mm to about 100 mm, such as by about 20 mm. In some embodiments, the nearest part of the crucible assembly 200 to the walls 502 can be a heater clamp (not shown) that can be used to secure the heater 220 to the crucible 201 or a crucible alignment tab (not shown) that can be used to align crucible assembly 200 on the cooling assembly 600 described below.

In some embodiments, the one or more of the walls 502 can be formed of a material having high thermal conductivity, such as copper. In some embodiments, each of the one or more vertical walls 502 can be formed of a single plate but may also be formed of a stack of a plurality of plates (not shown) which can be joined together, such as by use of a fastener or other material joining process. For example, in one embodiment, each vertical wall 502 includes four plates which are fastened to each other. The plates can each have a thickness in the direction in which the stack is formed from about 4 mm to about 60 mm.

The top plate 504 of the thermal isolation assembly 500 can be positioned on and attached to the one or more vertical walls 502, such as by use of a fastener. The top plate 504 may have a thickness in a vertical direction (i.e., Z-direction of FIG. 5) from about 1 mm to about 20 mm, such as about 3 mm. The top plate 504 can have a horizontal length in the Y-direction that is the same as the horizontal length of the side walls $502_3$, $502_4$. Furthermore, the top plate 504 can have a width in the X-direction that is the same as the horizontal length of the end walls $502_1$, $502_2$. The top plate 504 of the thermal isolation assembly 500 can be disposed above the top 206 of the crucible 201. For example, the top plate 504 can be about 5 mm to about 20 mm above the top 206 of the crucible 201. Wiring for inputs and outputs (I/O), such as the thermal sensor 250, can be routed through the evaporation source 100 in the spaces between the crucible assembly 200 and the thermal isolation assembly 500, such as the space between the walls 202 of the crucible assembly 200 and the walls 502 of the thermal isolation assembly 500, and the space between the top 206 of the crucible assembly 200 and the top plate 504 of the thermal isolation assembly 500. The top plate 504 can have an opening 506 overlying the opening 208 of the top 206 of the crucible 201. The opening 506 of the top plate 504 can be substantially the same size as the opening 208 of the top 206 of the crucible 201. The opening 506 can be aligned with the opening 208 such that the opening 506 overlies substantially all of the opening 208. The thermal isolation assembly 500 is configured so that no significant amount of thermal radiation from an external device, for example an external evaporation source, may propagate directly to the crucible 201.

In some embodiments, the thermal isolation assembly 500 does not include a base. The bottom of the walls 502 can be positioned below the bottom of the crucible assembly 200. In some embodiments, the bottom of the walls 502 are also positioned below the bottom of the cooling assembly 600 described in further detail below by about 20 mm to about 500 mm. On the lower side of the walls 502 there may be one or more internal threads (not shown) for connecting to the leg assembly 800 described above. The leg assembly 800 can connect the thermal isolation assembly 500 to the floor of the vacuum chamber 11 (see FIG. 1A) to support the weight of the thermal isolation assembly 500.

The thermal isolation assembly 500 can further include one or more cooling tubes 520. The cooling tubes 520 can be disposed around and/or adjacent to the one or more walls 502. The one or more cooling tubes 520 can have a supply 524 on the first side 511 of the thermal isolation assembly 500 and a return 525 on the second side 512 of the thermal isolation assembly 500. The supply 524 and the return 525 can be connected through a vacuum feedthrough (not shown) of the vacuum chamber 11 (see FIG. 1A) to an external cooling system (not shown). In one embodiment, water may be used as the coolant, but other coolants may also be used.

The one or more cooling tubes 520 can be disposed in one or more grooves 522 of the outer surface 523 of the side walls 502$_3$, 502$_4$. The outer surface 523 faces away from the interior region 204 of the crucible 201 (see FIG. 1B). Cooling fluid may be distributed through the cooling tube(s) 520 to prevent external sources of heat from causing thermal disturbances within the interior region 204 of the crucible 201. The one or more cooling tubes 520 can have a diameter from about 4 mm to about 10 mm, such as about 6 mm. In some embodiments, the one or more cooling tubes 520 pan make multiple horizontal passes (i.e., in the Y-direction of FIG. 5), along the horizontal lengths of the side walls 502$_3$, 502$_4$, such as about 4 horizontal passes. These horizontal passes may be spaced apart from each other by about 8 mm to about 200 mm, such as by about 30 mm. In some embodiments, the thermal isolation assembly 500 includes one cooling tube 520 that makes multiple horizontal passes (e.g., 4 horizontal passes) along the first side wall 502$_3$, wraps around the first end wall 502$_1$, and then makes multiple horizontal passes (e.g., 4 horizontal passes) along the second side wall 502$_4$. The spacing between the horizontal passes of the cooling tube 520 along one of the side walls 502$_3$, 502$_4$ can vary between about 10 mm to about 100 mm.

Figure 6A:
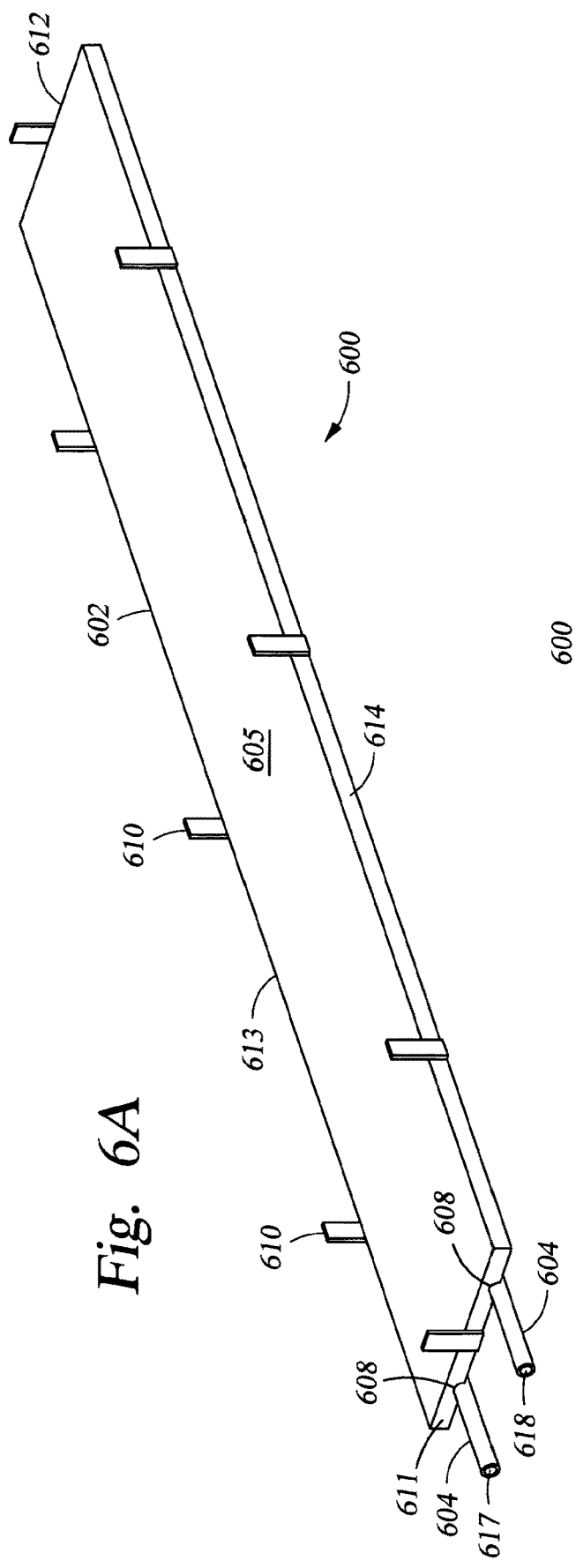
FIG. 6A is a perspective of a cooling assembly to be used in the evaporation source of FIG. 1B, according to one embodiment.
Figure 6B:
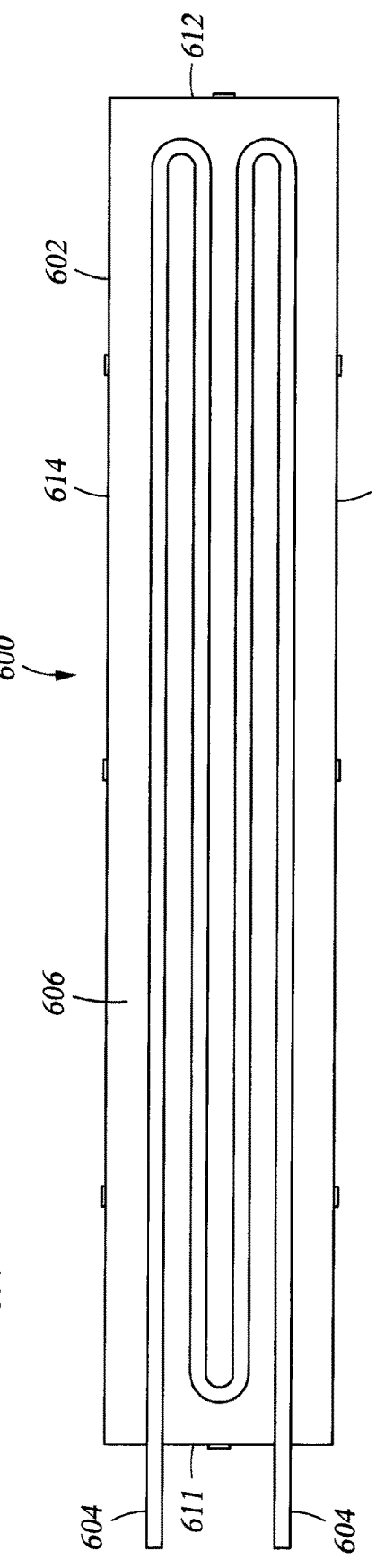
FIG. 6B is a bottom view of the cooling assembly, according to the embodiment of FIG. 6A.

FIG. 6A is a perspective of the cooling assembly 600, according to one embodiment. FIG. 6B is a bottom view of the cooling assembly 600, according to the embodiment of FIG. 6A. The cooling assembly 600 can be used too rapidly cool the deposition material 75 when processing is completed or stopped. The cooling assembly 600 includes the cooling plate 602 and the one or more cooling tubes 604 described above. The cooling plate 602 may be formed of a material having high thermal conductivity, such as copper or nickel-coated copper. The nickel coating can help prevent corrosion of the copper caused by potential exposure to the deposition material 75, such as selenium. In some embodiments, other materials may be used to form the cooling plate 602, such as stainless steel or molybdenum.

The cooling plate 602 may have a thickness in the vertical direction (i.e., the Z-direction in FIG. 6A) from about 4 mm to about 100 mm, such as 6 mm. The cooling plate 602 can have a rectangular shape with a first end 611, a second end 612, a first side 613, and a second side 614. The first end 611 may be separated from the second end 612 by a length of the cooling plate 602. The first side 613 may be separated from the second side 614 by a width of the cooling plate 602. The length (Y-direction) and width (X-direction) of the cooling plate 602 can be longer than the corresponding length and width of the crucible base 203 (see e.g., FIG. 2A), such as by about 8 mm. The crucible 201 can rest on a top surface 605 of the cooling plate 602. The top surface 605 of the cooling plate 602 may be flat. In some embodiments, a sheet 616 (see FIG. 1B) of material having a high thermal conductivity, such as graphite, may be disposed between the cooling plate 602 and the base 203 of the crucible 201 to further promote cooling of the crucible 201.

The one or more cooling tubes 604 can be disposed in one or more grooves 608 of a lower surface 606 of the cooling plate 602. Each of the one or more cooling tubes 604 can have a supply 617 for receiving coolant and a return 618 for sending coolant back to the cooling source (not shown). The one or more cooling tubes 604 can have a diameter from about 4 mm to about 20 mm, such as about 6 mm. The one or more grooves 608 can be sized according to the size of the one or more cooling tubes 604. The one or more cooling tubes 604 can be formed of a material having a high thermal conductivity, such as copper or nickel-coated copper. The one or more cooling tubes 604 can extend from the first end 611 towards the second end 612 in a looped pattern across the lower surface 606 of the cooling plate 602. For example, the cooling tube 604 shown in FIG. 6B shows two loops, each loop covering most of the length of the cooling plate 602 and about half of the width of the cooling plate 602. Other embodiments may include cooling tubes 604 having more or less loops.

Different cooling fluids may be distributed through the cooling tubes 604 to promote cooling of the crucible 201 and the deposition material 75. In one embodiment, the cooling tube 604 is connected through a three-way valve (not shown) outside of the vacuum chamber 11 (see FIG. 1A) enabling the different cooling fluids or no cooling fluid to be supplied to the cooling tube 604. In one embodiment, a different cooling fluid is supplied to the cooling tube 604 based on the temperature of the cooling plate 602 or the interior region 204 of the crucible 201 as measured by a thermal sensor, such as thermal sensor 250 described above. For example, during a deposition no cooling fluid may be supplied to the cooling tube 604, for example if no cooling is desired. One or more of the valves (not shown) connected to the cooling tube 604 may be opened at this time to prevent an excessive pressure increase inside the cooling tube 604 when the crucible 201 is heated. If a high temperature of the deposition material 75, such as a temperature greater than 200° C., is measured when a deposition is completed, then a cooling gas, such as air, may be supplied to the cooling tube 604. When the temperature decreases to a temperature below 200° C., a cooling liquid, such as cooling water, may be supplied to the cooling tube 604. Cooling water is not supplied to the cooling tube 604 when the measured temperature is greater than 200° C. because the high temperature may cause formation of large amounts of steam that could damage the cooling tube 604.

In some embodiments, the cooling plate 602 includes a plurality of tabs 610 mounted (e.g., screwed) to the one or more of the sides of the cooling plate 602, such as the first end 611, the second end 612, the first side 613, and the second side 614. For example, FIG. 6B shows six tabs 610 mounted to the cooling plate 602 with one tab 610 mounted to either end 611, 612 and two tabs 610 mounted to either side 613, 614. The plurality of tabs 610 can help to align the crucible assembly 200 on the cooling plate 602 between the tabs 610. The tabs 610 can have a thickness in a direction towards the side of the cooling plate 602 to which the tab 610 is mounted of about 1 mm to about 10 mm, such as about 3 mm. In some embodiments, part of the crucible assembly 200 may be positioned above and/or outside of the tabs 610. For example, the heater clamps described above may be positioned outside of the tabs 610. On. the lower surface 606 of the cooling plate 602, there may be one or more internal threads (not shown) for connecting to the leg assembly 800 described above. The leg assembly 800 can connect the cooling assembly 600 to the floor of the vacuum chamber 11 (see FIG. 1A) and support the weight of the cooling assembly 600 and components that are supported by the cooling assembly 600, such as the crucible assembly 200 and the deposition material 75.

There are numerous benefits to using the cooling assembly 600 that can rapidly cool the deposition material 75 when processing is completed or stopped as well as for temperature regulation during processing. For example, without using a cooling assembly, such as the cooling assembly 600, the deposition material 75 may take several hours to cool down to a temperature at which the vacuum chamber 11 can safely be vented to atmosphere so that maintenance or other operations can be performed. Furthermore, rapid cooling of the deposition material 75 prevents unnecessary evaporation of deposition material 75 that is wasteful. Also when this extra evaporated deposition material 75 condenses on components in the vacuum chamber 11, additional maintenance may be required to remove the material. For example, condensing deposition material can occur on the openings 402 of the sheets 404 of the lid assembly, which can require additional maintenance.

Figure 7A:
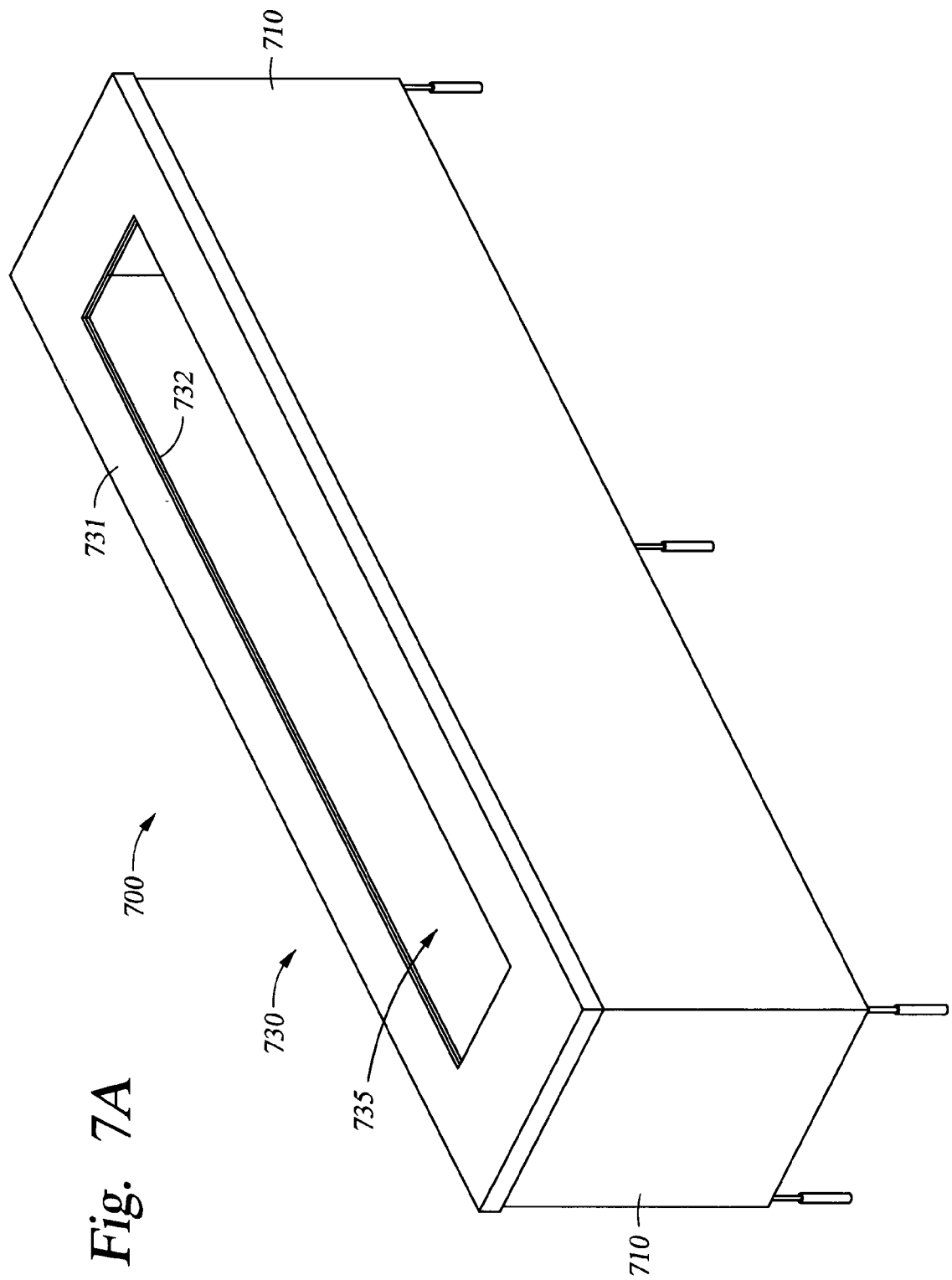
FIG. 7A is a perspective view of a heat shield assembly to be used in the evaporation source of FIG. 1B, according to one embodiment.

FIG. 7A is a perspective view of the heat shield assembly 700, according to one embodiment. Referring to FIGS. 1B and 7A, the heat shield assembly 700 includes the one or more side wall portions 710, the one or more base portions 720, and the lid portion 730. The one or more side wall portions 710 can be disposed around the thermal isolation assembly 500. The one or more materials used for the side wall portions 710 can be chosen to be chemically compatible with the material evaporated by the evaporation source 100, and such materials can include stainless steel and molybdenum as these materials pose a low risk of contaminating the evaporation process. The one or more base portions 720 can be disposed below the cooling assembly 600. The lid portion 730 can be disposed above the top plate 504 (see FIG. 5) of the thermal isolation assembly 500. The lid portion 730 may be supported by the one or more side wall portions 710. The heat shield assembly 700 may be supported by the leg assembly 800 described above. Each portion 710, 720, 730 can be formed of a highly reflective and heat-resistant material, such as molybdenum. In some embodiments, each portion 710, 720, 730 can include two or more sheets of the highly reflective, heat-resistant material, such as molybdenum. For example, FIG. 7A shows that the lid portion 730 includes a first sheet 731 disposed on top of a second sheet 732. The sheets 731, 732 may be cut and then folded before placing the first sheet 731 over the second sheet 732.

In these embodiments in which each portion 710, 720, 730 includes two or more sheets, the sheets may have a thickness from about 0.1 mm to about 1.0 mm, such as about 0.2 mm. One or more of the sheets (i.e., sheets in the portions 710, 720, 730) in these embodiments may include bumps 716 (see FIG. 7B) to maintain a spacing between the sheets or different portions of the sheets, such as a spacing from about 0.5 mm to about 3.0 mm. The side wall portions 710 can be spaced apart from the thermal isolation assembly 500 by about 4 mm to about 100 mm, such as by about 5 mm. For example, the side wall portions 710 can be spaced apart from the cooling tubes 520 of the thermal isolation assembly 500 by about 4 mm to about 100 mm. The lid portion 730 can be spaced apart from the thermal isolation assembly 500 by about 2 mm to about 100 mm, such as by about 3 mm. The lid portion 730 can include an opening 735 overlying the opening 208 of the top 206 of the crucible 201. The opening 735 can be substantially the same size as the opening 208 of the top 206 of the crucible 201. The opening 735 can be aligned with the opening 208 such that the opening 735 overlies substantially all of the opening 208.

FIG. 7B is a perspective sectional view of a side wall portion 710 and a portion of the frame 740 of the heat shield assembly 700, according to one embodiment. FIG. 7C is a close-up sectional view of a portion of FIG. 7B, according to one embodiment. The frame 740 may have a rectangular shape that can surround the thermal isolation assembly 500 (see FIG. 1B). The frame 740 may be positioned horizontally at a top 715 of the sidewall portions 710. In some embodiments, the frame 740 may be formed of stainless steel. The frame 740 may include a plurality of internal threads (not shown) for receiving a threaded portion of one of the legs 810 of the leg assembly 800 described above, so that the heat shield assembly may be supported by the leg assembly 800. Each side wall portion 710 can be formed of one sheet, such as a molybdenum sheet, folded over the frame 740. The side wall portion 710 folded over the frame 740 can include an outer section 711 disposed outside of the frame 740 and inner section 712 disposed inside the frame 740. The top 715 of the side wall portion 710 is disposed above the frame 740. The side wall portion 710 can include a ledge 714 extending inwardly from a bottom 718 of the outer section 711. The ledge 714 can be used to support the base portion 720 (see FIG. 7D) of the heat shield assembly 700. The ledge 714 is disposed at a vertical location spaced apart from a closest part of the cooling assembly 600, such as one of the cooling tubes 604, by about 2 mm to about 100 mm, such as by about 5 mm. At least one of the outer section 711 and the inner section 712 includes the bumps 716 described above, so that a spacing is maintained between the outer section 711 and the inner section 712, such as a spacing from about 0.5 mm to about 3.0 mm. In some embodiments, the bumps 716 can have a similar shape to the bumps 406 on the sheets 404 of the lid assembly 400. For example, each bump 716 can have a cross section that narrows as the bump 716 extends away from the outer section 711 or the inner section 712. Using bumps 716 with a cross section that narrows as the bumps 716 extends away from the outer section 711 or the inner section 712 reduces the amount of surface area contact between the outer section 711 and the inner section 712, which reduces the heat transfer between the outer section 711 and the inner section 712.

Figure 7D:
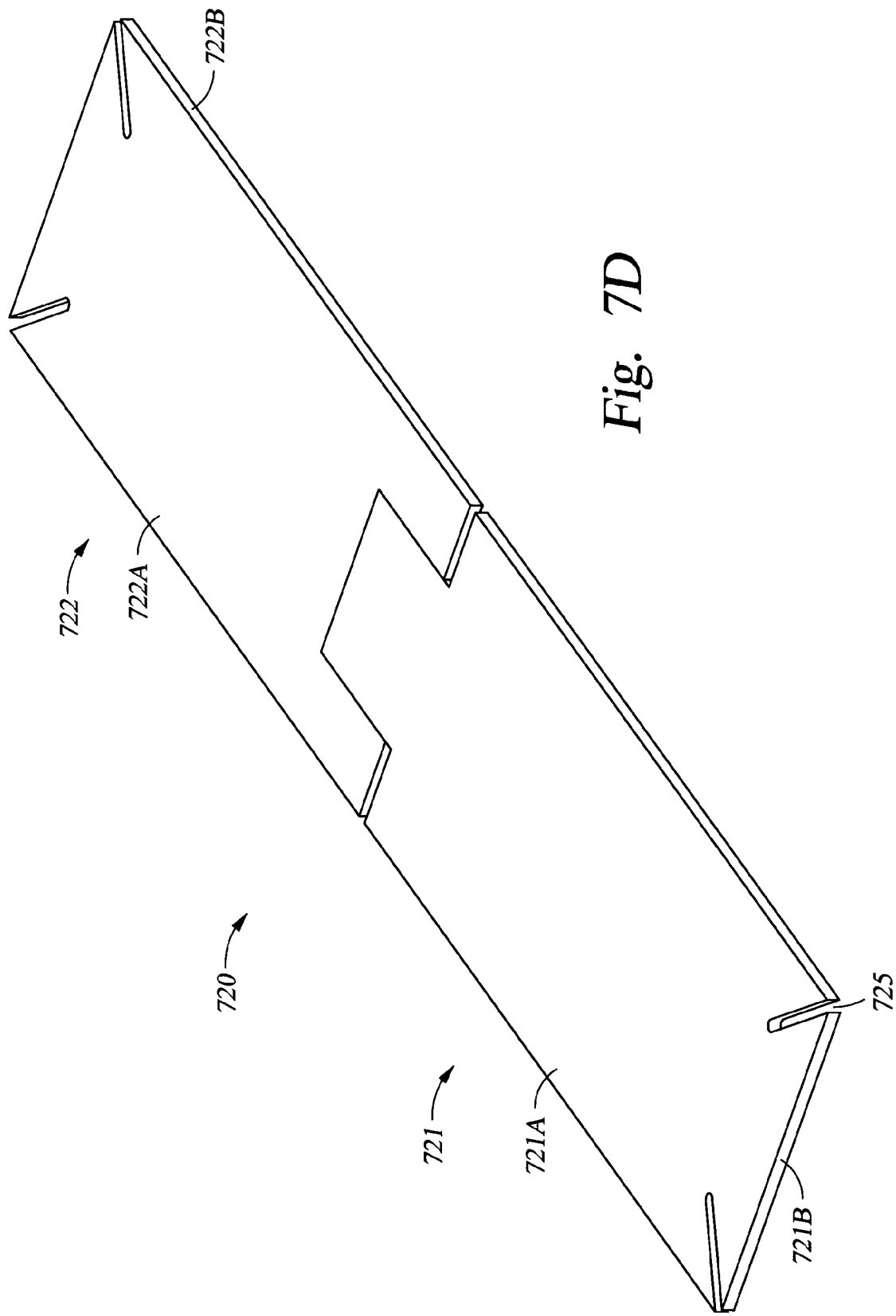
FIG. 7D is a perspective sectional view of a base portion of the heat shield assembly, according to one embodiment.

FIG. 7D is a perspective sectional view of the base portion 720 of the heat shield assembly 700, according to one embodiment. The base portion 720 can rest on the ledge 714 of the side wall portions 710 described above. The base portion 720 can include a first portion 721 and a second portion 722. The first portion 721 can include a first sheet 721A and a second sheet 721B. The second portion 722 can include a first sheet 722A and a second sheet 722B. At least part of the first portion 721 can overlap part of the second portion 722. Having the first portion 721 overlap the second portion 722 allows for easy removal of one or more of the first portion 721 and the second portion 722 for maintenance or other purposes. The first portion 721 and the second portion 722 may each include a plurality of passages 725 to allow a component of the evaporation source 100 to be routed to areas inside the side wall portions 710. For example, upper elements 811 of the legs 810 may be routed through the passages 725. As another example, wires for sensors, such as the thermal sensor 250 described above, may be routed through the passages 725. As another example, portions of the cooling tubes 520 and 604 may be routed through the passages 725.

While the foregoing is directed to embodiments of the present invention, other and further embodiments of the invention may be devised without departing from the basic scope thereof. Therefore, the scope of the present invention is determined by the claims that follow.

The invention claimed is:

1. An evaporation source for depositing a source material on a substrate, the evaporation source comprising:
   a crucible comprising:
      a base;
      a first plurality of walls surrounding an interior region of the crucible, the first plurality of walls including a first end wall, a second end wall opposite to the first end wall, a first side wall, and a second side wall opposite to the first side wall;
      a supporting ridge extending inwardly towards the interior region from at least two of the first plurality of walls;
      a thermal distributor disposed in the interior region of the crucible below the supporting ridge; and
      a lid disposed on the supporting ridge, the lid comprising two or more adjacently positioned sheets, wherein each sheet comprises a plurality of openings formed therethrough, and the plurality of openings in each sheet of the adjacently positioned sheets are not aligned with the plurality of openings formed in another of the adjacently positioned sheets.

2. The evaporation source of claim 1, wherein each sheet of the two or more adjacently positioned sheets further comprise:
   a first region of the sheet that has a first concentration of the openings and a second region of the sheet that has a second concentration of the openings, wherein the first concentration is greater than the second concentration, and the first region of the sheet is closer to one of the first or second end walls than the second region of the sheet is to one of the first or second end walls.

3. The evaporation source of claim 1, further comprising a thermal sensor disposed in the interior region of the crucible below the support ridge and above the thermal distributor.

4. The evaporation source of claim 1, further comprising:
   a cooling plate disposed below the base of the crucible, the cooling plate having a lower surface including one or more grooves; and
   a first cooling tube disposed in the one or more grooves of the lower surface.

5. The evaporation source of claim 1, further comprising a thermal isolation assembly disposed around the first plurality of walls of the crucible, the thermal isolation assembly comprising:
   a second plurality of walls spaced apart from the first plurality of walls of the crucible, wherein one or more of the second plurality of walls of the thermal isolation assembly includes an outer surface having one or more grooves, wherein the outer surface faces away from the interior region of the crucible; and
   a second cooling tube disposed in the one or more grooves of the outer surface.

6. The evaporation source of claim 5, further comprising a heat shield assembly that comprises:
   a frame;
   a plurality of side wall portions disposed around and spaced apart from the thermal isolation assembly, each side wall portion folded over the frame and including an outer section disposed outside of the frame, an inner section disposed inside the frame and a ledge extending inwardly from a bottom of the outer section;
   a lid portion disposed on the side wall portions; and
   a base portion disposed on the ledge of the side walls portions.

7. The evaporation source of claim 1, wherein the thermal distributor comprises:
   a plurality of first portions extending in a first horizontal direction and spaced apart in a second horizontal direction perpendicular to the first horizontal direction; and
   a plurality of second portions extending in the second horizontal direction and spaced apart in the first horizontal direction, wherein a spacing between the second portions in a first region of the interior region is shorter than the spacing between the second portions in a second region, wherein the first region is closer to one of the first or second end walls than the second region is to one of the first or second end walls.

8. An evaporation source for depositing a source material on a substrate, the evaporation source comprising:
   a crucible comprising:
      a base;
      a first plurality of walls surrounding an interior region of the crucible, the first plurality of walls including a first end wall, a second end wall opposite to the first end wall, a first side wall, and a second side wall opposite to the first side wall;
      a supporting ridge extending inwardly towards the interior region from the walls:
      a thermal distributor disposed in the interior region of the crucible below the supporting ridge; and
      a thermal sensor disposed in the interior region of the crucible below the support ridge and above the thermal distributor.

9. The evaporation source of claim 8, further comprising:
   a lid disposed on the supporting ridge, the lid comprising two or more adjacently positioned sheets, wherein each sheet comprises a first region that has a first concentration of openings and a second region that has a second concentration of the openings, wherein the first concentration is greater than the second concentration, and the first region of the sheet is closer to one of the first or second end walls than the second region of the sheet is to one of the first or second end walls.

10. The evaporation source of claim 8, further comprising:
    a cooling plate disposed below the base of the crucible, the cooling plate, having a lower surface including one or more grooves; and
    a first cooling tube disposed in the one or more grooves of the lower surface.

11. The evaporation source of claim 8, further comprising a thermal isolation assembly disposed around the first plurality of walls of the crucible, the thermal isolation assembly comprising:
    a second plurality of walls spaced apart from the first plurality of walls of the crucible, wherein one or more of the walls of the second plurality of walls of the thermal isolation assembly includes an outer surface having one or more grooves, wherein the outer surface faces away from the interior region of the crucible; and
    a second cooling tube disposed in the one or more grooves of the outer surface.

12. The evaporation source of claim 1, further comprising a heat shield assembly that comprises:
    a frame a plurality of side wall portions disposed around and spaced apart from the thermal isolation assembly, each side wall portion folded over the frame and including an outer section disposed outside of the frame, an inner section disposed inside[1] the frame and a ledge extending inwardly from a bottom of the outer section;

a lid portion disposed on the side wall portions; and a base portion disposed on the ledge of the side walls portions.

13. The evaporation source of claim 12, wherein the lid portion includes an opening overlying an opening of a top of the crucible, wherein the opening of the lid portion has a same size as the opening of the top of the crucible.

14. A vapor deposition system for depositing a source material on a substrate comprising:

a vacuum chamber including one or more walls for enclosing a processing region of the vapor deposition system;

one or more evaporation sources disposed in the processing region, each evaporation source comprising:

a crucible comprising:

a base;

a first plurality of walls surrounding an interior region of the crucible, the plurality of walls including a first end wall, a second end wall opposite to the first end wall, a first side wall, and a second side wall opposite to the first side wall;

a supporting ridge extending inwardly towards the interior region from at least two of the first plurality of walls; a thermal distributor disposed in the interior region of the crucible below the supporting ridge; and a lid disposed on the supporting ridge, the lid comprising two or more adjacently positioned sheets, wherein each sheet comprises a plurality of openings formed therethrough, and the plurality of openings in each sheet are not aligned with the plurality of openings formed in an adjacently positioned sheet.

15. The vacuum deposition system of claim 14, wherein each of the two or more sheets further comprise:

a first region of the sheet that has a first concentration of the openings and a second region of the sheet that has a second concentration of the openings, wherein the first concentration is greater than the second concentration, and the first region of the sheet is closer to one of the end walls than the second region of the sheet is to one of the end walls.

16. An evaporation source for depositing a source material on a substrate, the evaporation source comprising:

a crucible comprising:

a base;

a first plurality of walls surrounding an interior region of the crucible, the first plurality of walls including a first end wall, a second end wall opposite to the first end wall, a first side wall, and a second side wall opposite to the first side wall;

a supporting ridge extending inwardly towards the interior region from the walls; and a thermal distributor disposed in the interior region of the crucible below the supporting ridge, the thermal distributor comprising:

a plurality of first portions extending in a first horizontal direction and spaced apart in a second horizontal direction perpendicular to the first horizontal direction; and a plurality of second portions extending in the second horizontal direction and spaced apart in the first horizontal direction, wherein a spacing between the second portions in a first region of the interior region is shorter than the spacing between the second portions in a second region, wherein the first region is closer to one of the first or second end walls than the second region is to one of the first or second end walls; and a thermal sensor disposed in the interior region of the crucible below the support ridge and above the thermal distributor.

17. The evaporation source of claim 16, further comprising:

a lid disposed on the supporting ridge, the lid comprising two or more adjacently positioned sheets, wherein each sheet comprises a first region that has a first concentration of openings and a second region that has a second concentration of the openings, wherein the first concentration is greater than the second concentration, and the first region of the sheet is closer to one of the first or second end walls than the second region of the sheet is to one of the first or second end walls.

18. The evaporation source of claim 16, further comprising:

a cooling plate disposed below the base of the crucible, the cooling plate, having a lower surface including one or more grooves; and a first cooling tube disposed in the one or more grooves of the lower surface.

19. The evaporation source of claim 16, further comprising a thermal isolation assembly disposed around the first plurality of walls of the crucible, the thermal isolation assembly comprising:

a second plurality of walls spaced apart from the walls of the crucible, wherein one or more of the walls of the second plurality of walls of the thermal isolation assembly includes an outer surface having one or more grooves, wherein the outer surface faces away from the interior region of the crucible; and a second cooling tube disposed in the one or ore grooves of the outer surface.

20. The evaporation source of claim 19, further comprising a heat shield assembly that comprises:

a frame a plurality of side wall portions disposed around and spaced apart from the thermal isolation assembly, each side wall portion folded over the frame and including an outer section disposed outside of the frame, an inner section disposed inside[1] the frame and a ledge extending inwardly from a bottom of the outer section;

a lid portion disposed on the side wall portions; and a base portion disposed on the ledge of the side walls portions.

* * * * *